(12) United States Patent
Libove et al.

(10) Patent No.: US 6,433,720 B1
(45) Date of Patent: Aug. 13, 2002

(54) METHODS, APPARATUSES, AND SYSTEMS FOR SAMPLING OR PULSE GENERATION

(75) Inventors: Joel M. Libove, Orinda; Steven J. Chacko, Oakland, both of CA (US)

(73) Assignee: Furaxa, Inc., Orinda, CA (US)

( * ) Notice: Subject to any disclaimer, the term of this patent is extended or adjusted under 35 U.S.C. 154(b) by 0 days.

(21) Appl. No.: 09/876,016

(22) Filed: Jun. 6, 2001

Related U.S. Application Data
(60) Provisional application No. 60/273,721, filed on Mar. 6, 2001.

(51) Int. Cl.$^7$ .................................................. H03M 1/66
(52) U.S. Cl. ........................................ 341/144; 341/145
(58) Field of Search ................................ 341/144, 145, 341/152, 156

(56) References Cited

U.S. PATENT DOCUMENTS

| | | | |
|---|---|---|---|
| 3,205,376 A | 9/1965 | Berry et al. ............... 307/88.5 |
| 3,527,966 A | 9/1970 | Forge ......................... 307/319 |
| 3,622,808 A | 11/1971 | Uchida ....................... 307/268 |
| 3,624,416 A | 11/1971 | Bleickardt .................. 307/269 |
| 4,060,739 A | 11/1977 | Russer et al. ............... 307/319 |
| 4,360,867 A | 11/1982 | Gonda ........................ 363/158 |
| 4,442,362 A | 4/1984 | Rao ............................ 307/108 |
| 4,706,045 A | 11/1987 | Ouyang et al. ............. 331/117 |
| 4,727,340 A | 2/1988 | Agoston et al. ............... 33/50 |
| 4,736,380 A | 4/1988 | Agoston ...................... 372/38 |
| 4,755,742 A | 7/1988 | Agoston et al. ............. 324/58 |
| 4,758,736 A | 7/1988 | Agoston et al. ........... 307/268 |
| 4,806,818 A | 2/1989 | Kandpal ...................... 333/218 |
| 4,873,499 A | 10/1989 | Algor ......................... 331/117 |
| 4,928,248 A | 5/1990 | Takahashi et al. ........... 372/38 |
| 4,965,467 A | 10/1990 | Bilterijst .................... 307/352 |
| 4,995,044 A | 2/1991 | Blazo ......................... 372/25 |
| 5,062,113 A | 10/1991 | Takahashi ................... 372/25 |
| 5,113,094 A | 5/1992 | Grace et al. ................ 307/529 |
| 5,115,409 A | 5/1992 | Stepp ......................... 364/841 |
| 5,157,559 A | 10/1992 | Gleason et al. ............. 360/46 |
| 5,515,014 A | 5/1996 | Troutman .................... 332/178 |
| 5,574,755 A | 11/1996 | Persico ....................... 375/295 |
| 5,587,687 A | 12/1996 | Adams ........................ 330/253 |
| 5,635,863 A | 6/1997 | Price, Jr. ........................ 327/3 |
| 5,708,377 A | 1/1998 | Bradley ....................... 327/91 |
| 5,768,700 A | 6/1998 | Kardontchik ............... 455/333 |
| 5,847,623 A | 12/1998 | Hadjichristos ............. 332/105 |
| 5,872,446 A | 2/1999 | Cranford, Jr. et al. ...... 323/315 |
| 5,900,747 A | 5/1999 | Brauns .......................... 327/9 |
| 5,986,501 A | 11/1999 | Rafati et al. ................ 330/254 |
| 6,043,943 A | 3/2000 | Rezzi et al. .................. 360/46 |
| 6,054,889 A | 4/2000 | Kobayashi ................... 327/357 |
| 6,078,277 A * | 6/2000 | Cheng ......................... 341/152 |
| 6,087,871 A | 7/2000 | Kardo-Syssoev et al. ... 327/189 |
| 6,118,339 A | 9/2000 | Gentzler et al. ............ 330/149 |
| 6,281,822 B1 * | 8/2001 | Park ............................ 341/144 |

OTHER PUBLICATIONS

P. Gray & R. Meyer; Analysis and Design of Analog Integrated Circuits; pp. 590–605; John Wiley & Sons; 1984.
Maxmim 32–Channel Sample/Hold Amplifier with Output Clamping Diodes, MAX5167; Publication No. 19–1675; Apr. 2000.

* cited by examiner

*Primary Examiner*—Brian Young
(74) *Attorney, Agent, or Firm*—Blakely, Sokoloff, Taylor & Zafman

(57) ABSTRACT

A method and apparatus for generating ultra-fast (picosecond-range) electrical sampling apertures and pulses, requiring only a single transition of a control signal, is disclosed. Implemented in a novel circuit architecture that is suited to fabrication as a low-cost monolithic integrated circuit, the method produces more stable, more reproducible, and more precisely shaped sampling apertures and pulses, with lower power usage and cost, than conventional techniques. The combination of speed and reproducibility enabled by the invention allows the integration of large numbers of virtually identical fast sampling apertures or pulse generators on a single IC, enabling single-shot capture of such a rapid sequence of samples that even a single cycle of a very fast, microwave frequency, electronic waveform may be precisely sampled at multiple points.

45 Claims, 14 Drawing Sheets

US 6,433,720 B1

METHODS, APPARATUSES, AND SYSTEMS FOR SAMPLING OR PULSE GENERATION

CROSS REFERENCE TO RELATED APPLICATION

This non-provisional U.S. Patent Application claims the benefit of U.S. Provisional Patent Application No. 60/273,721 entitled "Method and Apparatus for Generating Ultra-fast Sampling Apertures and Pulses" filed on Mar. 6, 2001 by inventors Libove et al.

FIELD OF THE INVENTION

The invention relates generally to sampling an electrical signal, and more particularly to short duration sampling of an input electrical signal and short duration pulse generation.

BACKGROUND OF THE INVENTION

The generation of pulses and the generation of sampling apertures is important in a number of systems. With the operating frequency of systems increasing due to technological improvements, it becomes important to provide narrower or "ultra-fast" pulses and sampling apertures to match such increased operating frequencies of systems. A few exemplary systems where such "ultra-fast" pulses or sampling apertures are desirable include fiber optic communication systems, radar communication systems, and time domain reflectometers.

Prior art systems for generating fast pulses have relied on expensive means such as step recovery diodes (SRDs), which generate a fast rising electrical voltage step that is then converted into an impulse by one or more capacitors, which differentiate the step, or a pulse-reversing device such as a shorted transmission line, which provides a delayed, inverted edge which cancels out the initial edge after a brief delay. The resulting pulse can be used to generate a sampling aperture by the use of a Schottky diode bridge whose diodes are turned on momentarily by the energy in the pulse. Sampling oscilloscopes such as the Tektronix 11801/CSA803 or the Agilent 54750A use such techniques. Another prior art technique for generating fast sampling apertures is to use a Gilbert Multiplier circuit which multiplies an input waveform by a fast pulse, such as one generated by a step recovery diode and a shorted transmission line or capacitor.

The above prior art techniques such as the SRD-based circuits suffer from variations in pulse position with temperature, and moderately high amounts of jitter. Secondly, the variable input impedance of the Schottky diodes is sub-optimal for input impedance matching. Additionally, the SRD requires several nanoseconds of carrier charging and discharging time, limiting the pulse-repetition rate to approximately 100 MHz. Also, it is difficult to incorporate into monolithic designs due to the constraints imposed in fabricating the step recovery diode, capacitors, and Schottky diodes on the same substrate. Finally, these circuits can be damaged easily by application of an over-voltage to the input.

DETAILED DESCRIPTION

In the following detailed description of the invention, numerous specific details are set forth in order to provide a thorough understanding of the invention. However, it will be obvious to one skilled in the art that the invention may be practiced without these specific details. In other instances well known methods, procedures, components, and circuits have not been described in detail so as not to unnecessarily obscure aspects of the invention.

The invention relates to a method for producing very short duration electrical pulses or sampling apertures for use in a number of possible electrical signaling and measurement systems. Applications include use as a sub-component in systems that can use either an ultra-fast time-gating element (sampler) or an ultra-fast pulse generator (pulser). Examples of such systems include ultra-wideband (UWB) communication systems, RADAR systems, transmission imaging systems, laser diode drivers, fiber optic receivers, sampling oscilloscopes, microwave spectrum analyzers, time domain reflectometers (TDRs), and other electrical communications and instrumentation apparatus.

The invention uses novel methods, circuits and systems to achieve superior sampling and pulse generation capability at reduced cost. Furthermore, the invention allows the fabrication of larger and more tightly matched groups of sampling apertures or pulse generators.

Figure 1:
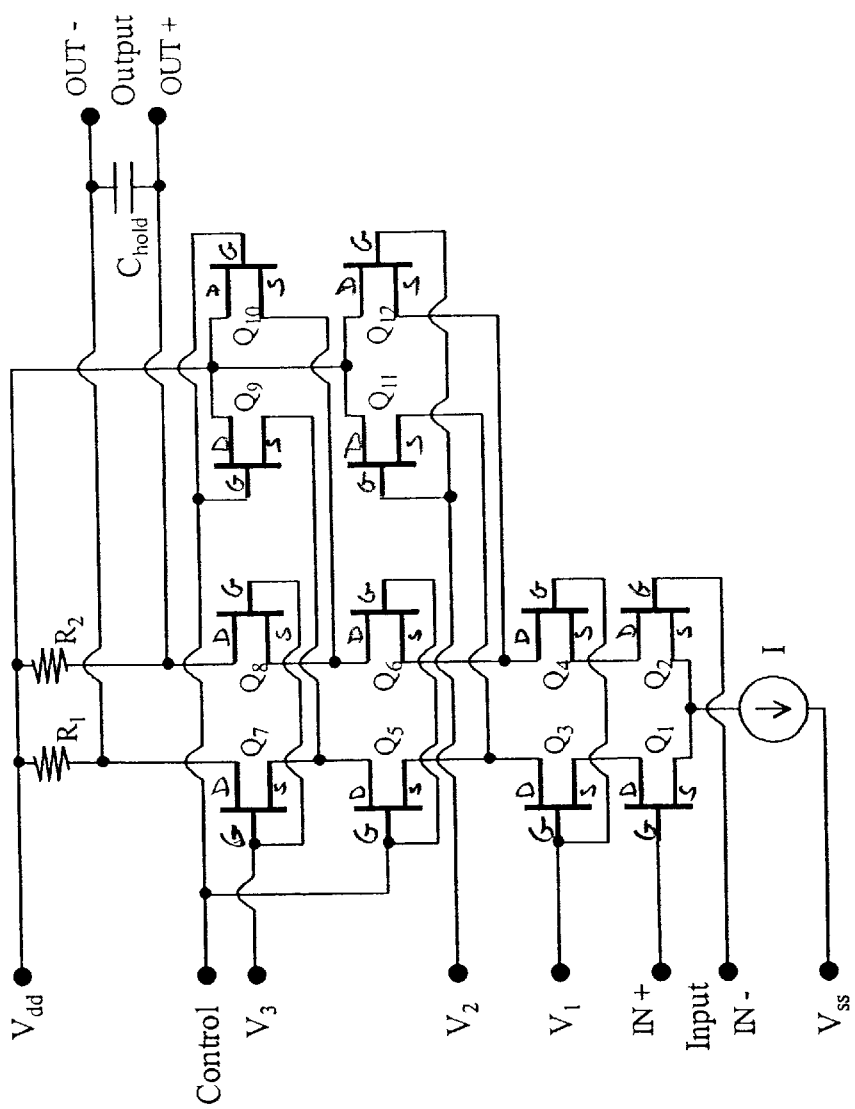
FIG. 1 is a schematic diagram of an embodiment of the invention.

Referring now to FIG. 1, an embodiment of a sampler/pulser circuit of the invention is illustrated. In the sampler/pulser circuit of FIG. 1, a single edge of an electrical control signal effects both the initiation and extinction of an aperture or pulse that is generated. This is achieved by level-activated switching elements (transistors or diodes) within the circuit. The sampler/pulser circuit of FIG. 1 uses differentially-paired transistors (DPTs) as the level-activated switching elements. In this circuit, enhancement mode GaAs MESFETS are used for transistors Q1 through Q12 coupled together as shown in FIG. 1. Each of the transistors includes a control terminal (i.e., a gate, denoted by "G"), a first terminal (i.e., a source, denoted by "S"), and a second terminal (i.e., a drain, denoted by "D"). An input signal, "Input", is provided between terminals IN+ and IN− and coupled to the control terminals or gates of a conventional differential pair comprised of transistors Q1 and Q2. The drain terminals of transistors Q1 and Q2 can optionally couple to the source terminals of a conventional cascode stage comprised of transistors Q3 and Q4 respectively. The gates of transistors Q3 and Q4 are biased by a fixed voltage $V_1$ that may typically be approximately one volt higher than the highest potential on IN+ and IN− terminals so they can stay on. The drain terminals of Q3 and Q4 (or alternatively drain terminals of Q1 and Q2 without the cascode stage) are coupled to the source terminals of transistors Q5, Q6, Q11, and Q12, comprising a bottom portion of the sampler/pulser circuitry. The drain terminals of Q5 and Q6 form the outputs of the bottom portion, and are coupled to the source terminals of Q7, Q8, Q9 and Q10, comprising a top portion of the sampler/pulser circuitry.

The sampler/pulser circuit has three distinct operational states determined by the voltage level of the control signal, Control. The circuit transitions sequentially through all three states as the voltage level of the control signal, Control, falls from an initial voltage that is greater than the fixed input voltage $V_3$, to the second state in which Control is between the voltage of the fixed input voltage $V_3$ and the fixed voltage $V_2$, to the third state in which Control's voltage is less than fixed voltage $V_2$. Typically $V_2$ can be approximately between one to two volts higher than voltage $V_1$, and $V_3$ can be approximately between one to two volts higher than $V_2$. The control signal, Control, typically begins at a voltage level that is approximately the voltage level of Vdd, the power supply. The voltage level of Vdd is typically one to three volts higher than $V_3$. At the time one desires to create a sampling aperture or pulse, the control signal is slewed in a negative direction, so that it ultimately ends up at a voltage that is less than $V_2$. If the control signal is initially greater than $V_3$ by more than a few tenths of a volt, transistor $Q_9$ and $Q_{10}$ are "on" (biased into the forward conduction region) and transistors $Q_7$ and $Q_8$ are "off" (biased so that essentially no current flows), resulting in the output nodes being pulled up to $V_{dd}$, causing the sampling gate to be turned "off" (the output nodes contain no signal). Similarly, if the level of the control signal at the end of its falling transition is less than $V_2$ by a few tenths of a volt, transistors $Q_{11}$ and $Q_{12}$ are "on" and transistors $Q_5$ and $Q_6$ are "off", resulting in the output nodes being pulled up to $V_{dd}$, and the sampling gate again being turned off. However, during the active falling of the control signal, when the control signal is between $V_2$ and $V_3$, transistors $Q_5$, $Q_6$, $Q_7$, and $Q_8$ are all "on" (and $Q_9$, $Q_{10}$, $Q_{11}$, and $Q_{12}$ all "off") resulting in the sampling gate being turned on. In this case, the differential input signal across the input terminals IN+ and IN− is multiplied by the circuit gain to generate a differential output signal across OUT+ and OUT− terminals.

Thus, as the control signal Control traverses the range defined by $V_3$ and $V_2$, this off-on-off sequence results in a sampling aperture being created in which the input is coupled to the output for a brief, and highly controllable period of time. At all other times the output is isolated from the input. In the event that the invention is to be used as a sampler (and not a pulser) the output value is desired to be held even after the sampling aperture is closed, and an optional capacitor $C_{HOLD}$ is connected between the two output terminals, as shown in FIG. 1. The circuit generates an aperture/pulse regardless of direction of the transition of the trigger signal (low-to-high, or high-to-low). If, on the other hand, an aperture or pulse is only desired during one transition, then the current source, I, may be turned off, using conventional circuitry, during the time the transition occurs in which we do not desire to generate an aperture or pulse. For example, if an aperture is desired only during the rising edge of Control, the current source I would be turned off after the rising edge is over, and turned on again shortly before the next rising edge of Control. This will avoid any current being channeled to the output terminals during the falling transition of Control.

Transistors $Q_3$ and $Q_4$ are optional. However, when transistors $Q_3$ and $Q_4$ are utilized, the input stage operates in a cascode mode to prevent switching transients in $Q_5$, $Q_6$, $Q_{11}$, and $Q_{12}$ from coupling to the input terminals via drain-to-gate capacitance in $Q_1$ and $Q_2$. This results in far lower "kick out" voltage at the inputs and better high-frequency gain and higher input impedance. While the circuit of FIG. 1 is a differential-mode embodiment, it would be obvious to one skilled in the art that a simpler single-ended (non-differential) implementation may be used by removing transistors Q4, Q6, Q8, Q10 and Q12. Additionally, it will be obvious to one of ordinary skill in the art after reading this disclosure that the differential output of the circuit of FIG. 1 can be converted into a single-ended output by coupling the OUT+ and OUT− output terminals to a conventional differential amplifier or BALUN (Balanced-to-unbalanced) transformer.

Figure 2:
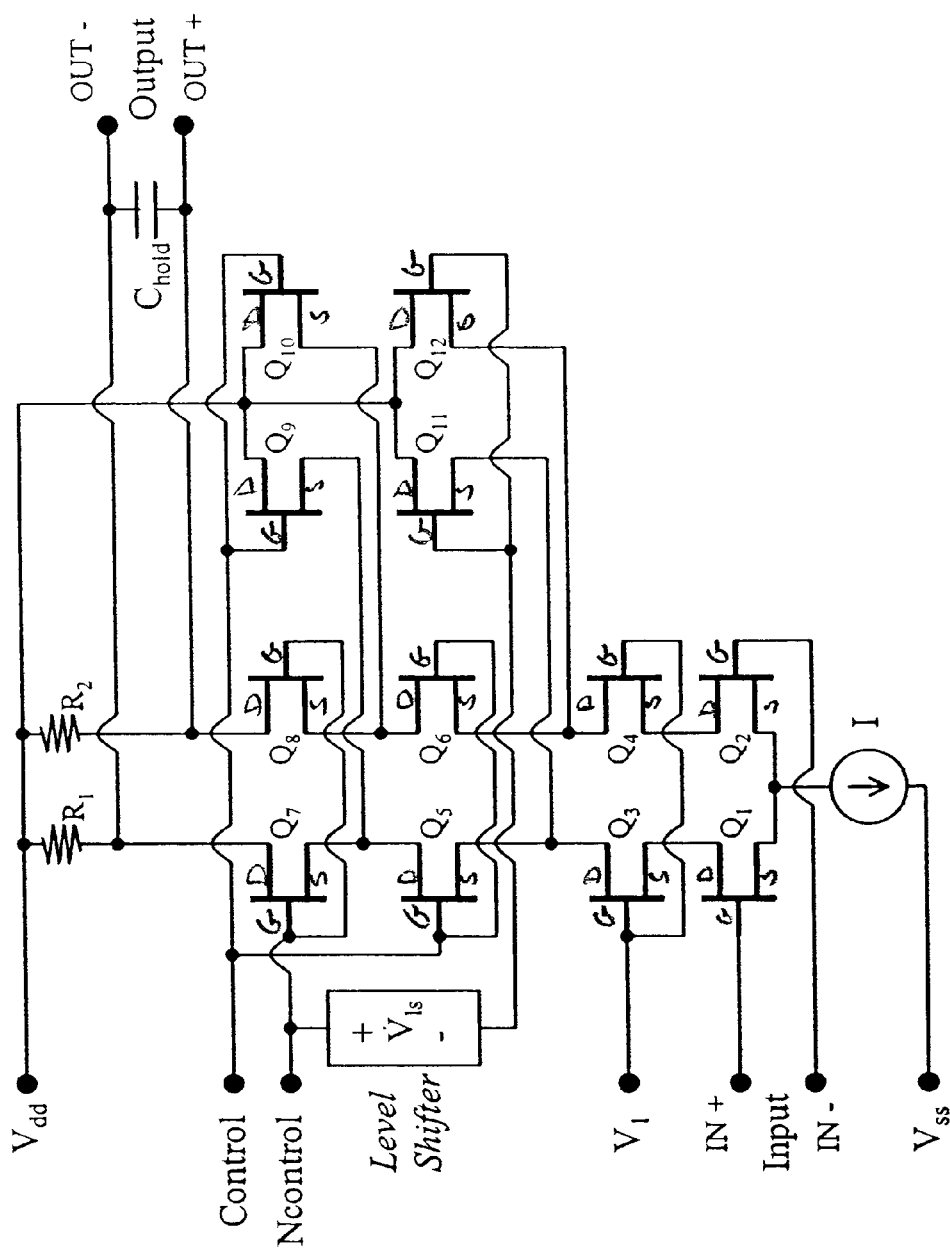
FIG. 2 is a schematic diagram of another embodiment of the invention.

Referring now to FIG. 2, an alternate embodiment of the invention is illustrated which incorporates a level-shifting circuit. The addition of the level-shifting circuit allows for the use of a slower pair of differential control signals in place of a fast single control signal, resulting in lower power dissipation in the control-signal generation circuitry. Additionally, noise immunity is increased and ground bounce is reduced. The operation of the resulting circuitry is an extension of the operation of the circuitry in FIG. 1. The fixed voltage levels $V_2$ and $V_3$ of FIG. 1 are now replaced by an inverted version, "Ncontrol", of the falling "Control" signal and a similar level-shifted version of Ncontrol, labeled Ncontrol-$V_{ls}$, as shown in the waveform diagram of FIG. 3. The control Ncontrol-$V_{ls}$ is Ncontrol shifted downwards by the voltage $V_{ls}$. By using the differential signals Control and Ncontrol (and its level-shifted version, Ncontrol-$V_{ls}$) the "rate of closure" to the switching events is twice as fast as when a single signal "Control" is used (as in FIG. 1). By using differential control signals, the cost, power consumption and edge slew rate requirements of controlling circuitry that generates Control and Ncontrol can be reduced.

Figure 3:
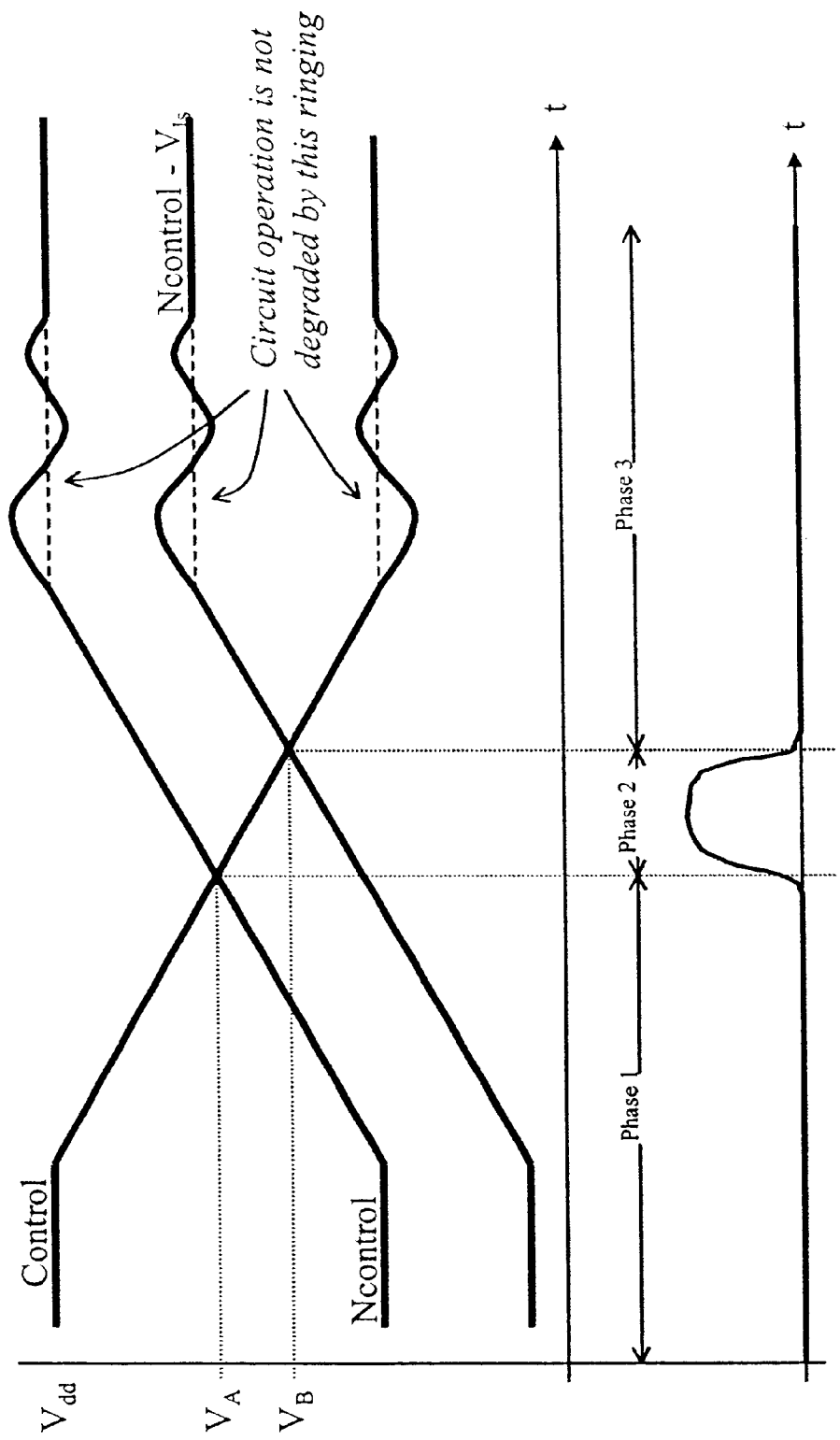
FIG. 3 is a waveform diagram illustrating the operation of the embodiment of the invention illustrated in FIG. 2.

Referring now to FIG. 3, the sampler/pulser circuit of FIG. 2 has three distinct operational states (Phase 1, Phase 2, and Phase 3), determined by the voltage level of the differential control signals, Control, Ncontrol and Ncontrol-$V_{ls}$. The circuit moves through these operational states as the control signal Control falls, from an initial voltage that is greater than the rising voltage level on Ncontrol, to a final voltage that is less than the level of the control signal Ncontrol-$V_{ls}$ in its level state after rising. There are two switching points which set off these operational states which are denoted by the switch point voltage levels $V_A$ and $V_B$ in FIG. 3.

If the control signal, Control, is initially greater than Ncontrol by more than a few tenths of a volt, transistors $Q_9$ and $Q_{10}$ are "on" (biased into the forward conduction region) and $Q_7$ and $Q_8$ are "off" (biased so that essentially no current flows), resulting in the output nodes being pulled up to $V_{dd}$, causing the sampling gate to be turned "off" (the output nodes contain no differential signal). Similarly, if the resting level of the control signal, Control, is less than Ncontrol-$V_{ls}$ by a few tenths of a volt, transistors $Q_{11}$ and $Q_{12}$ are "on" and $Q_5$ and $Q_6$ are "off", resulting in the output nodes being pulled up to $V_{dd}$, and the sampling gate again being turned off. However, during the active falling of the control signal, Control, when it is between Ncontrol and Ncontrol-$V_{ls}$, which occurs at voltages $V_A$ and $V_B$, respectively, $Q_5$, $Q_6$, $Q_7$, and $Q_8$ are all "on" (and $Q_9$, $Q_{10}$, $Q_{11}$, and $Q_{12}$ all "off"), and the differential input signal, multiplied by the circuit gain, is provided on the differential output nodes, with the result that the sampling gate is turned on.

Thus, as the control signal traverses the range defined by the voltages $V_A$ and $V_B$, defined by the intersection of the falling signal Control and the rising signals Ncontrol and Ncontrol-$V_{ls}$, this off-on-off sequence results in a sampling aperture being created in which the input is coupled to the output for a brief, highly controllable, period of time. At all other times the output is isolated from the input. This allows the generation of a very precise sampling aperture or pulse, even if the control input signal has ringing or other anomalies outside the range between voltages $V_A$ and $V_B$, as shown in FIG. 3. The circuit generates an aperture/pulse regardless of direction of the transition of the trigger signal (low-to-high, or high-to-low). Transistors $Q_3$ and $Q_4$ and bias voltage $V_1$ are optional but, when installed, allow the input stage to operate in cascode mode to prevent switching transients in $Q_5$, $Q_6$, $Q_{11}$, and $Q_{12}$ from coupling to the input terminals via drain-to-gate capacitance in $Q_1$ and $Q_2$. This results in far lower "kick out" voltage at the inputs and better high-frequency gain and input impedance characteristics. While the circuit shown in FIG. 2 is a differential-mode embodiment, it would be obvious to one skilled in the art that a simpler single-ended (non-differential) implementation may be used by removing the appropriate transistors.

Figure 4:
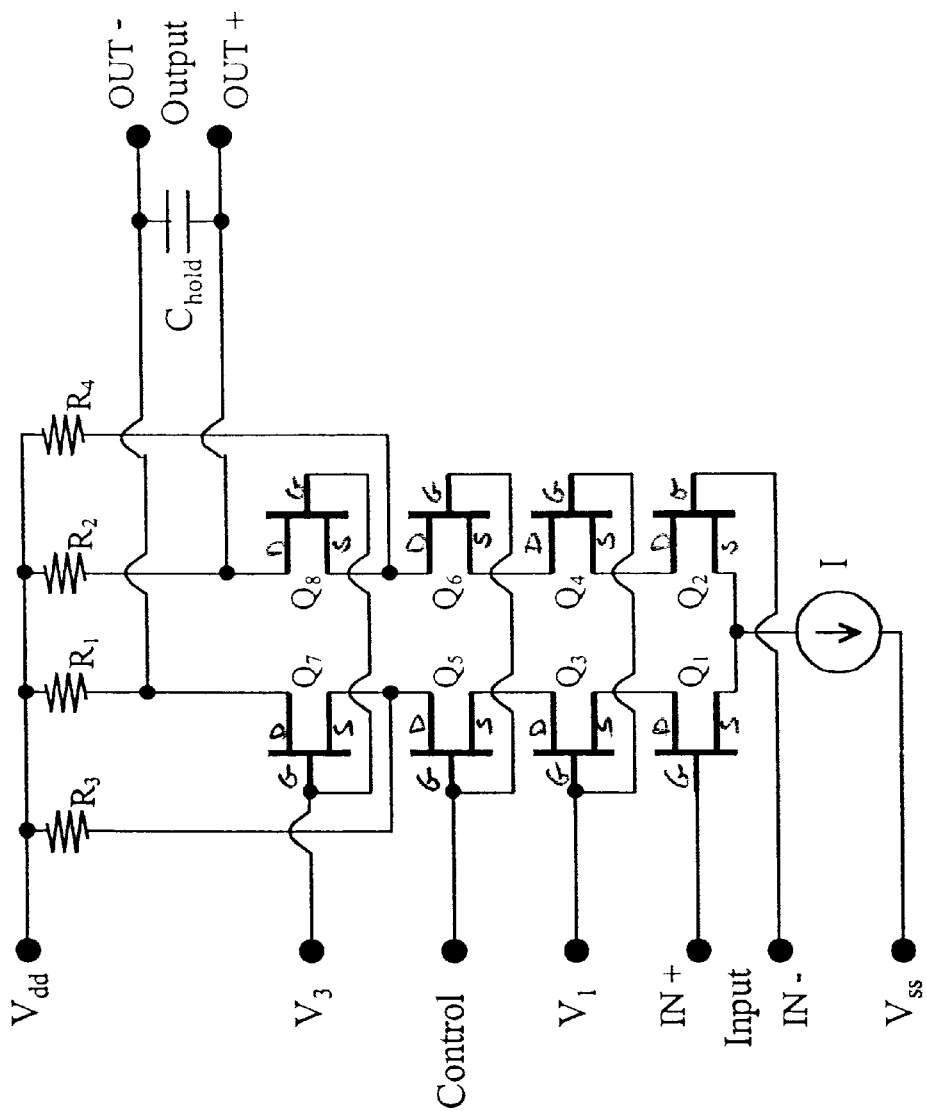
FIG. 4 is a schematic diagram of another embodiment of the invention.

Referring now to FIG. 4, an alternate embodiment of the invention is illustrated. The circuit coupled together as shown in FIG. 4 is a simplified version of the embodiment of the invention illustrated in FIG. 1. In the circuit of FIG. 4, transistors Q9, Q10, Q11, Q12 and voltage $V_2$ of the circuit of FIG. 1 are removed, and resistors R3 and R4 added. The control signal, Control, is initially at a voltage level that is approximately the same as voltage $V_{dd}$, (typically 5 Volts) and is therefore higher than voltage $V_3$ (which is typically 4 Volts). This results in transistors Q5 and Q6 being forward biased, with their drain currents flowing in resistors R3 and R4 respectively, and transistors Q7 and Q8 being turned off, as the Source terminals of transistors Q7 and Q8 in this case are a more positive voltage than voltage $V_3$, causing these transistors not to conduct. As the control signal, Control, slews in a negative direction, so that it is below the voltage V3, transistors Q7 and Q8 begin to conduct, and transistors Q5 and Q6 remain in conduction, allowing the current from transistors Q3 and Q4 to flow, via the transistor pair Q5 and Q6 and the transistor pair Q7 and Q8, to output terminals Out+ and Out−, thereby causing the output to be proportional to the signal at input terminals In+ and In−. However, as the control signal, Control, continues to slew in a negative direction, so that Control reaches a voltage more negative than voltage $V_1$ (which is typically 2 volts), transistors Q3 and Q4 cease to conduct, effectively turning the sampling head off. In this way, the circuit of FIG. 4 achieves a momentary sampling "window" just as did the circuit of FIG. 1. While the embodiment of FIG. 4 has fewer components, its isolation performance (ability to block the input signal from reaching the output terminals during the time the sampling aperture is "off") is not as good as that of the embodiment of FIG. 1, due to the fact that transistors Q9, Q10, Q11 and Q12 are not present to effectively shunt (short out) signals that are coupled via parasitic capacitance from the source to the drain of transistors Q7 and Q8 during the time the sampling aperture is turned off, when Control has a voltage level above voltage $V_3$.

Figure 5:
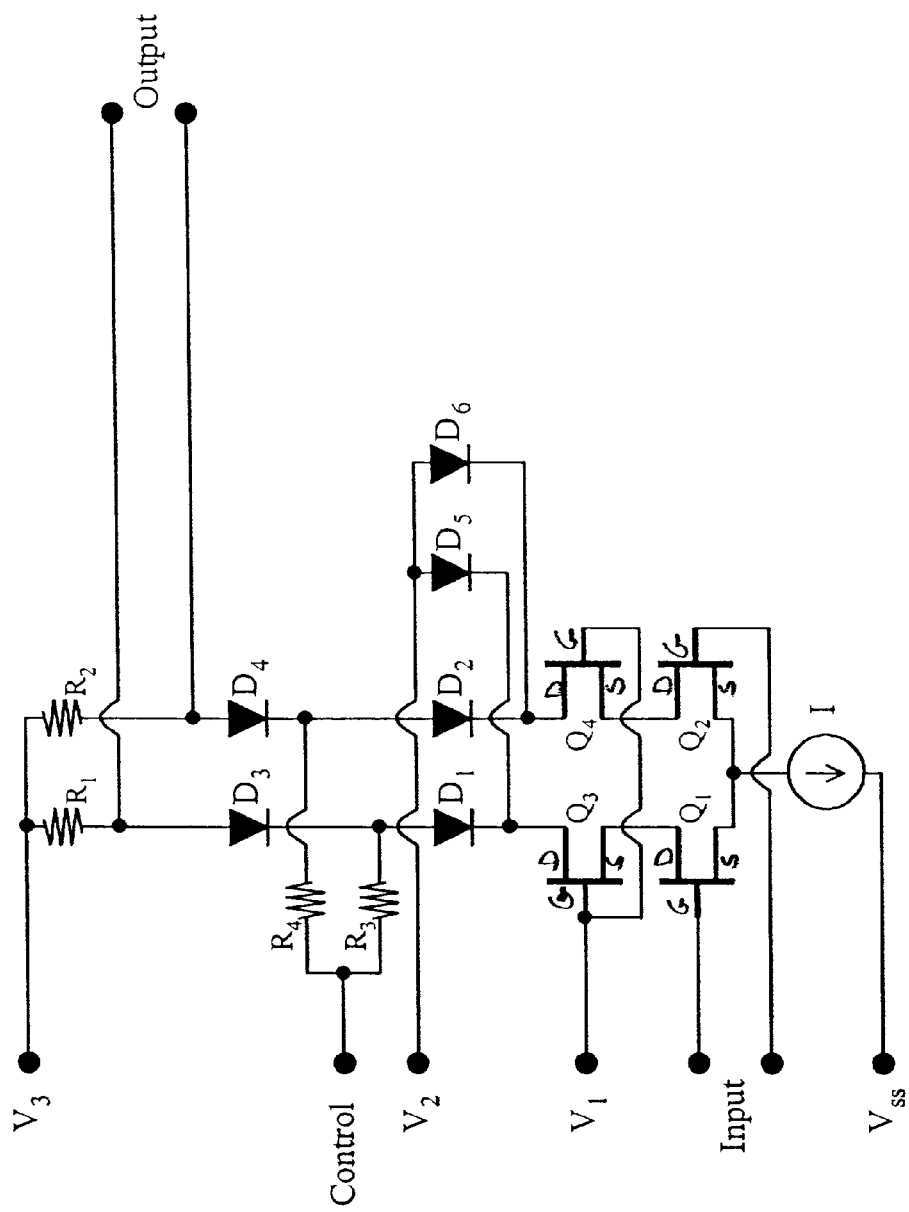
FIG. 5 is a schematic diagram of another embodiment of the invention.

Referring now to FIG. 5, another embodiment of the invention is illustrated. The circuit illustrated in FIG. 5 uses differentially-paired diodes (DPDs) as level-activated switching elements and operates similarly to the DPT embodiment of FIG. 1. When the control signal, Control, is at a voltage between $V_2$ and $V_3$, diodes $D_1$, $D_2$, $D_3$, and $D_4$ all conduct (are forward biased), diodes D5 and D6 do not conduct (are reverse biased), and the differential input, multiplied by the circuit gain, is present at the differential output. At other times the output is isolated from the input. For example, initially when the voltage of the control signal is above voltage $V_3$, diodes $D_3$ and $D_4$ are reverse-biased, and do not conduct, resulting in the sampling circuit being "off". Similarly, at the end of the transition of the control signal, when the voltage level of the control signal has gone below the voltage $V_2$, Diodes $D_1$ and $D_2$ are reverse-biased, also resulting in the sampling circuit being "off". Optional transistors $Q_3$ and $Q_4$ and voltage $V_1$ function similarly to that as described previously in the circuit of FIG. 1. Diodes $D_5$ and $D_6$ assure that the transistors of the circuit of FIG. 5 with the DPDs always remain in the forward active region, even when diodes $D_1$ and $D_2$ are completely turned off. While the circuit shown in FIG. 5 is a differential-mode embodiment, it would be obvious that a simpler single-ended implementation may be used by removing the appropriate diodes and transistors. Similarly, it will be obvious to one skilled in the art after reading this disclosure that the "level-shifting" embodiment of the invention (similar to that shown in FIG. 2) can be combined with the embodiment of FIG. 5 having the DPDs.

Figure 6:
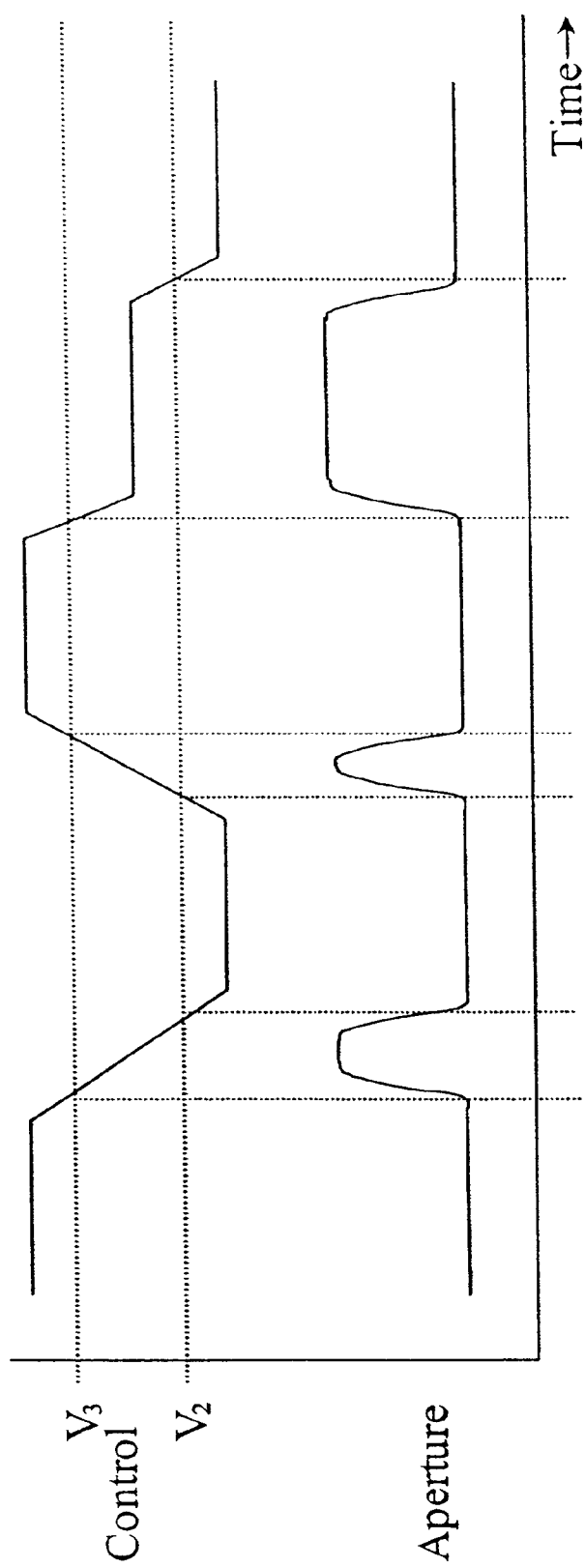
FIG. 6 is a waveform diagram illustrating the operation of the embodiments of the invention illustrated in FIG. 1 and FIG. 5.

Referring now to FIG. 6, a waveform diagram illustrates the operation of the circuit of FIG. 5. The level of the control signal, Control, as it is slewed in a single direction, as illustrated in FIG. 6, creates the sampling aperture or a pulse, rather than the derivative of a signal resulting from the control signal. A single edge of the control signal is thereby used in generating the aperture/pulse, resulting in lower time-jitter as well as superior stability and aperture shape over a range of variables (e.g. temperature and IC process variation).

In the invention, the aperture/pulse duration is determined by the level of the control signal, allowing for a variable duration aperture or pulse via manipulation of the control signal rather than any circuit change (e.g. the need for addition of a low-pass filter at the output) to lengthen the pulse width. That is, the slope or rate of change in the control signal, Control, determines the duration or period of time of the sampling aperture (i.e., sampling time period) or the pulse width of a pulse. Since the initiation and extinction of the pulse or aperture are determined independently by two voltage levels ($V_3$ and $V_2$, respectively, in FIGS. 3 and 7), the aperture/pulse duration can be dynamically chosen from a minimum duration, determined by integrated circuit (IC) device constraints, to a duration of arbitrary length, as illustrated in the third aperture in FIG. 6. This is useful in signaling systems employing Pulse-Width Modulation (PWM), which allows for spectral manipulation of the resulting aperture/pulse.

The circuit and method of the invention exhibit good noise rejection on both the input and control signals when the control signal is not near transition levels $V_2$ and $V_3$. This is due to the small voltage range over which the operation of the circuit changes (when one DPT or DPD pair becomes inactive and an alternate pair becomes active), limiting noise susceptibility to brief periods in the transition of Control. Imperfections in the control signal, including ringing at the end of the transition, are thereby effectively ignored by the invention, as this ringing typically occurs well after the control signal voltage has fallen far below the transition voltage ($V_2$ or $V_3$) and does not reach a level sufficient to cause the level-activated switching elements to alter their state. Similarly, the problem of inadequate slew rate that may be generated by a driver-circuit at the beginning of a transition is also ignored, as this typically occurs before the control signal has slewed sufficiently to reach the voltage range between $V_3$ and $V_2$. This tolerance to ringing and other anomalies in the input signal allows a larger number of the sampling aperture cells of the invention to be integrated onto a chip and driven by the same input, as the invention is less sensitive than conventional samplers to the degradation of the input waveform due to the resulting higher parallel load. Transitions of the control signal in both directions from high to low and low to high can be used to generate an aperture/pulse, allowing for two possible apertures/pulses per cycle of the control signal.

The circuit and method of the invention enable the user to precisely and independently adjust the starting point and stopping point of each sampler or pulser in a group of such samplers or pulsers in an integrated circuit. In this way it is possible to compensate for mismatches in devices such as transistors in the integrated circuit, or to adjust the position or duration of the pulse for other reasons such as to change the frequency content of the pulse or its time-alignment with other signals. For example, in the method shown in FIG. 1, it is possible to make the pulse or aperture occur earlier in time by together increasing both $V_3$ and $V_2$ by the same amount of voltage. In this way, Control will transition below $V_3$ at an earlier time, causing the pulse or aperture to start earlier, and then Control will also later transition below $V_2$ at an earlier time, ending the pulse or aperture earlier. Or, if the user instead desires a wider pulse or aperture, this may be accomplished by increasing $V_3$ and decreasing $V_2$ so the pulse or aperture begins earlier and ends later. It will be apparent to those skilled in the art, after reading this disclosure, that the alternate embodiments shown in FIGS. 2, 4 and 5 allow similar adjustment in the duration and position of the pulses and apertures they generate. The invention's ability to allow adjustment of both position and duration of an aperture or pulse by merely changing two direct current (D.C.) voltages, enables easier, lower cost, matching of multiple pulses or apertures than is possible with prior art methods.

The methods and circuits of the invention have no extraordinary device requirements (such as a step-recovery diode or capacitors), relying instead, on common design elements, available across a broad range of integrated circuit device technologies, allowing a simple, monolithic, single device-type implementation. The circuit, with minor modifications, can be implemented in many integrated circuit (IC) technologies, including Gallium Arsenide (GaAs) MESFET, GaAs Heterojunction Bipolar Transistor (HBT), GaAs High Electron Mobility Transistor (HEMT), Silicon-Germanium (SiGe), Indium Phosphide (InP), and Silicon bipolar or MOS technology. Also, the circuit topology of the invention allows all transistors to be of the same type and have identical areas, allowing an "all NMOS/N-channel design, requiring no speed-compromising P-channel (or PNP) devices. These features, taken together, result in increased implementation flexibility and better performance, due to the ability to tightly match transistors or diodes on an IC, and reduce costs of manufacturing.

The methods and circuits of the invention have inputs with high, relatively constant, impedance over the aperture/pulse cycle, as the input transistors (Q1 and Q2 in FIGS. 1, 2,4 and 5 for example) are usually always in a forward-biased mode. The circuit architectures of the preferred embodiments have true differential inputs and outputs, and do not require feedback level-shifting compensation, resulting in a very high common-mode-rejection ratio (CMRR) and reduced complexity. Furthermore, the inputs to the circuits (i.e. "input channels") in the preferred embodiments are exceptionally resistant to damage from over-voltage conditions due to high-impedance FET gate inputs. Additionally, the resulting circuit architectures have much lower excitation power requirements, as there is no high-current charging. This decrease in power results in decreased power dissipation, less thermal drift and decreased unintended emission of radiation from the aperture/pulse circuitry. Finally, the absence of charge and discharge times from the invention, allows for very high pulse repetition frequencies, on the order of over a billion pulses per second, rather than a typical 10 to 50 million pulses per second with prior circuits.

The lower power dissipation afforded by the invention allows a large number of precisely matched, and time-skewed, pulsers or sampling apertures to be integrated onto a single integrated circuit, for the purposes of, for example, 1) sampling several channels of analog data simultaneously, 2) sampling a single channel at several sequential instants in time, enabling an ultra-fast multi-gigasample/second single-shot oscilloscope, 3) generating a complex pulse made up of a sequence of individual pulses staggered in time, or 4) correlating an incoming signal with a complex aperture made up of a sequence of individual weighted apertures staggered in time. The method and apparatus can easily be paralleled in a single IC to allow for a number of possible high-speed direct waveform synthesis applications, and multiple-aperture correlator and channel-equalizer applications that were formerly impractical or uneconomical to fabricate, due to the size of, and difficulty in precisely matching the delay and amplitude of, conventional SRD-based pulse generators.

Figure 7:
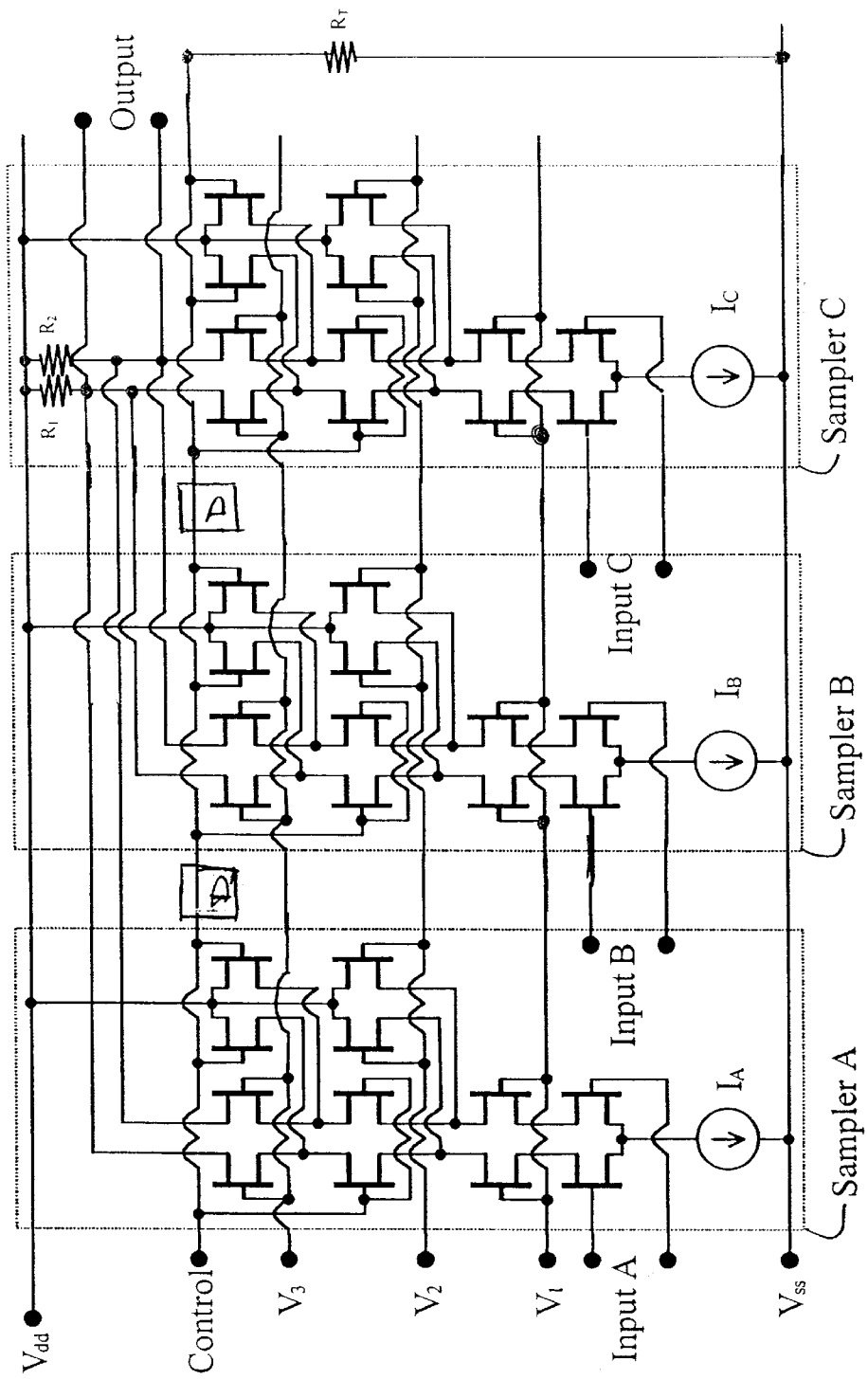
FIG. 7 is a schematic diagram of another embodiment of the invention.

Referring now to FIG. 7, multiple samplers/pulsers are illustrated combined into a single integrated circuit (IC). Samplers/pulsers can also be referred to as aperture/pulse elements. In FIG. 7 a first sampler/pulser (labeled sampler A) having inputs A, a second sampler/pulser (labeled sampler B) having inputs B, and a third sampler/pulser (labeled sampler C) having inputs C are coupled together as shown sharing a pair of pull-up resistors (R1 and R2). Each sampler/pulser can also be referred to herein as a sampling head or a pulse generator. Delay lines elements D can optionally be inserted as shown before the control inputs of sampler B and sampler C with a termination resistor $R_T$ coupled to the control signal input of the last sampler stage, sampler C. Otherwise, the delay line elements D can be bypassed or removed.

The combination of multiple samplers/pulsers allows for direct synthesis and detection of complex pulses. The stability of the resulting architectures, combined with the matching of a monolithic integrated circuit (IC) implementation allows for faster and more complex pulse generating or sampling structures. By using multiple pulse generator circuits combined together on a single IC, and fired off in rapid succession via a string of short delay lines, direct synthesis of ultra-fast complex waveforms may be achieved, such as those required in the emerging areas of ultra-wideband (UWB) radar and communications. Similarly, when used in a receiver, the input from the antenna may be connected, via a string of short delay lines, to the inputs of several of the sampling heads of the invention, for the purpose of providing an output whose amplitude is proportional to the convolution of the input pulse and a pre-determined matched waveform. If the matched waveform is to contain only positive amplitudes, the input signal is only connected to the positive inputs (right-hand FET gates, Q2) of the three sampling heads shown in FIG. 7, while the negative inputs are connected to ground. If however, the matched waveform is desired to have negative lobes, such as an approximation of a sin(t)/t waveform, then the input is connected to the negative input (left hand FET gate, Q1) of the leftmost sampling head (labeled generator A), while a delayed version of the input is connected to the positive input (right-hand FET gate, Q2) of the middle sampling head (labeled generator B), and a further delayed version of the input is connected to the negative input (left hand FET gate, Q1) of the rightmost sampling head (labeled generator C). In this way, for example, if 30 picosecond delay lines are used, the differential output, $V_{out}$, of the entire system will be given, at a time slightly greater than t, by:

$$V_{out} = [-I_A \times V_{in}(t-60 \text{ ps})] + [I_B \times V_{in}(t-30 \text{ ps})] - [I_C \times V_{in}(t)]$$

This ultra-fast correlation capability is important when detecting and recognizing incoming pulses that have complex, distorted, wave shapes, such as, for example in UWB communications systems that may be deliberately band-limited, so as to avoid interfering with aircraft and public service bands, or in a fiber optic receiver in which dispersion and high-frequency attenuation have smeared the impulse response of the system. The invention will facilitate lowering costs of such correlating receivers for low cost communication systems of the future. The tight time-matching and stability, low power dissipation, high and constant input impedance, and small size and low cost of the sampling heads and pulsers of the invention will help facilitate a new generation of low cost radar communications transmitters and receivers, time domain reflectometers and transmission test sets, and time domain imaging systems.

Figure 8:
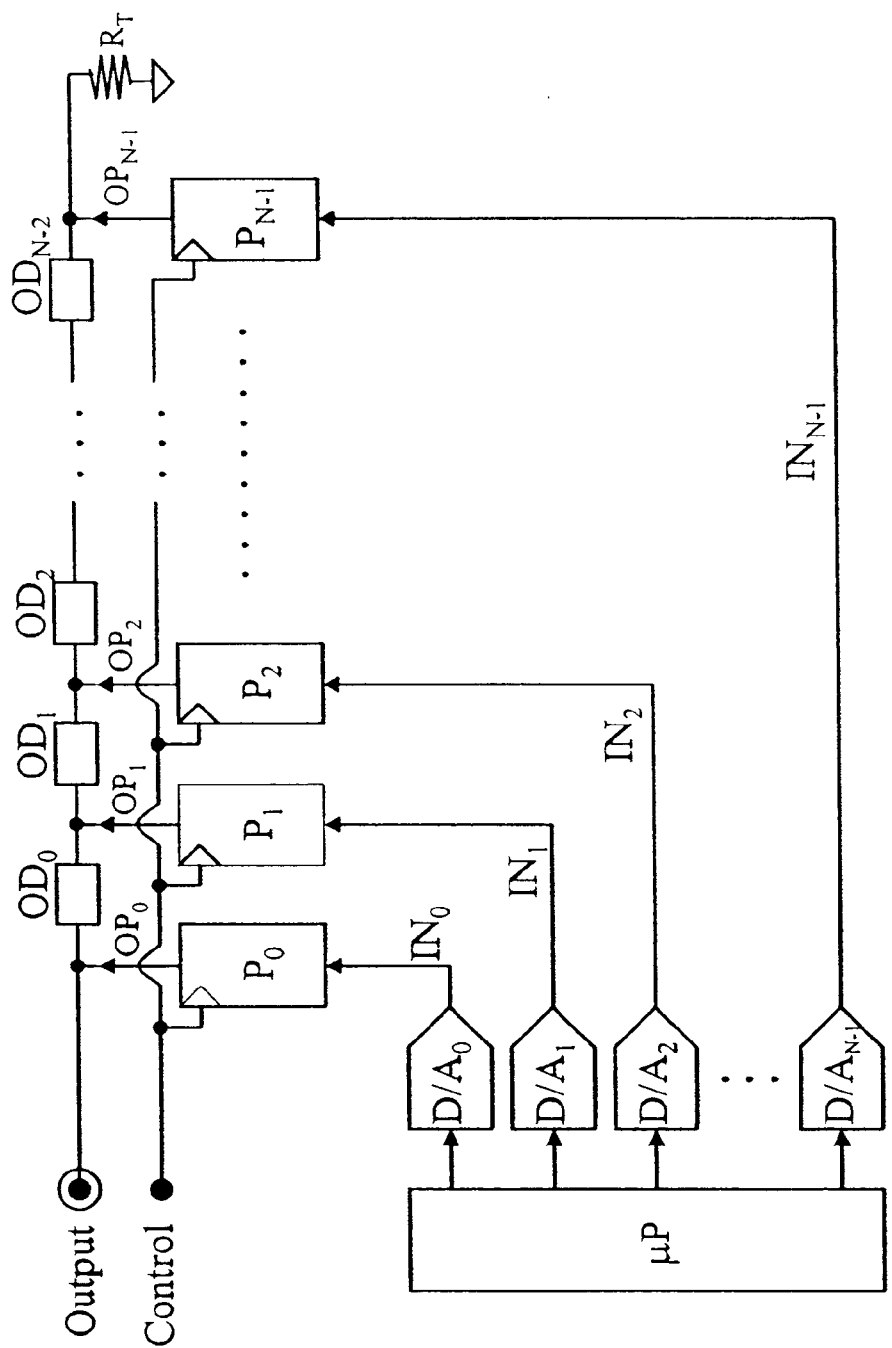
FIG. 8 is a block diagram of a system utilizing the embodiments of the invention.

Referring now to FIG. 8, multiple pulse generation elements (samplers/pulsers) are combined to provide a ultra-fast arbitrary waveform generator (AWG). A single-chip, multi-cell array of the pulsers of the invention connected through a common output, coupled with an intelligent control algorithm (using a combination of amplitude, position, and duration modulation), will result in an AWG with capabilities exceeding current feasible designs. The AWB as illustrated in the embodiment of FIG. 8 includes a microprocessor to generate digital signals corresponding a desired shape of a waveform, N digital to analog (D/A) converters, $D/A_0$ through $D/A_{N-1}$, N pulsers, $P_0$ through $P_{N-1}$, and a string of analog delay lines $OD_0$ through $OD_{N-2}$ coupled together as illustrated. The N pulsers, $P_0$ through $P_{N-1}$, of the invention receive in parallel N analog voltages $IN_0$ through $IN_{N-1}$, generated by the N D/A converters, $D/A_0$ through $D/A_{N-1}$ which are of conventional design. The N D/A converters, $D/A_0$ through $D/A_{N-1}$ generate the N analog voltage levels $IN_0$ through $IN_{N-1}$ from the digital signals which correspond to the desired shape of a waveform previously generated by the microprocessor. The N analog voltage levels are coupled to the +INPUT terminals (gates of Q1) of the N pulsers. In this way, the N pulsers will produce N simultaneous pulses, each with an amplitude proportional to the analog voltage level present on its respective +INPUT terminal. The voltages $V_1$, $V_2$ and $V_3$ couple into all N samplers as illustrated in FIG. 1. The voltages $V_1$, $V_2$ and $V_3$ are DC bias voltages that are identical for all N samplers. Upon receiving a single falling edge of the control signal, Control, pulsers $P_0$ through $P_{N-1}$ create a set of very brief parallel pulses, that are imposed, simultaneously on the inputs of the string of analog delay lines $OD_0$ through $OD_{N-2}$ respectively.

Figure 9:
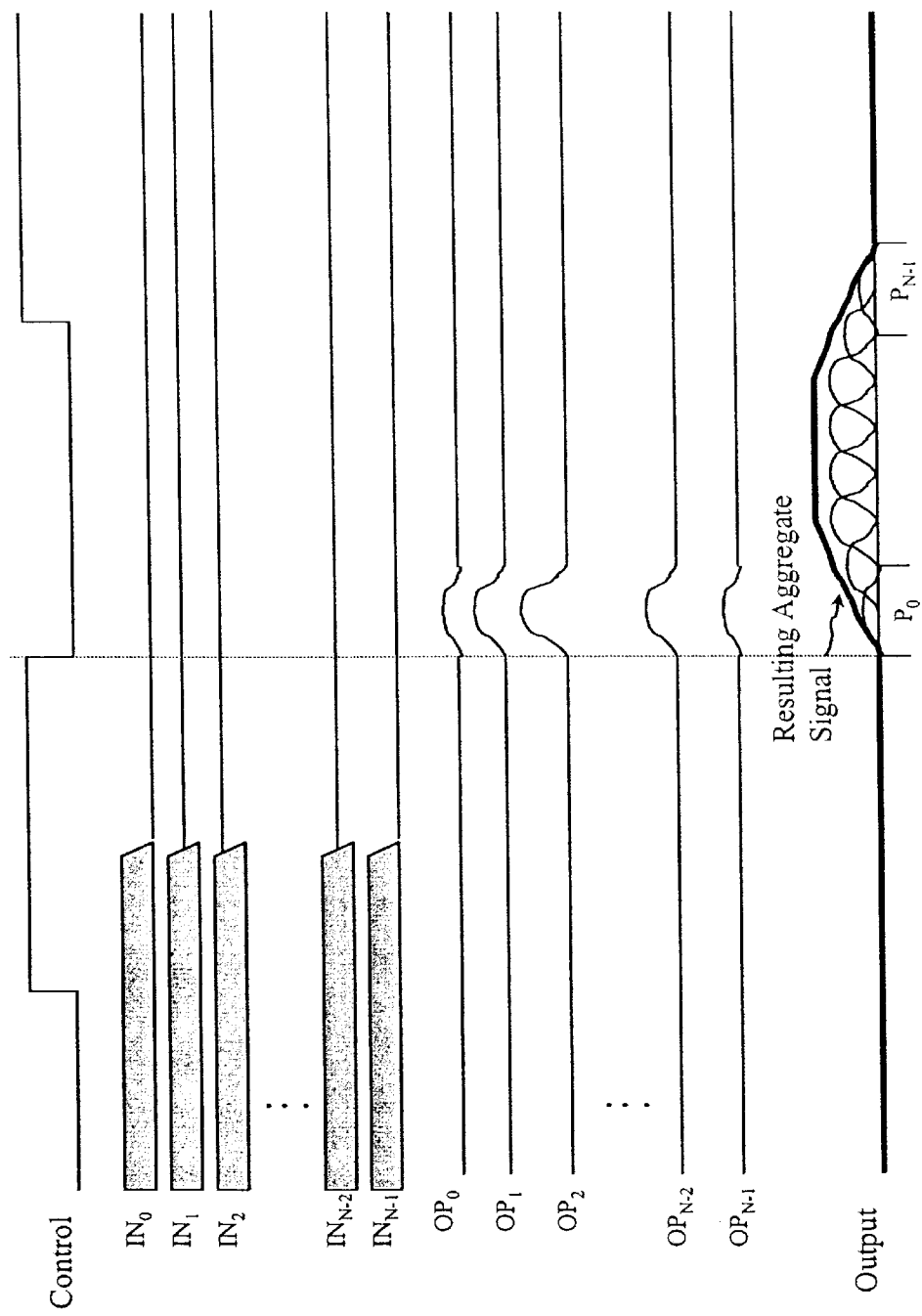
FIG. 9 is a waveform diagram illustrating the operation of the system illustrated in FIG. 8.

FIG. 9 illustrates waveform diagrams of the intermediate signals and the final resultant output signal of the generated waveform for the system of FIG. 8. The signal $OP_0$ immediately appears at the Output, while the signal $OP_1$ appears one delay later, as it is delayed by delay line $OD_0$. Similarly, signal $OP_2$ appears two delays later, etc, until signal $OP_{N-1}$ appears N-1 delays later, resulting in a very rapid sequence of voltage levels proportional to $IN_0$ through $IN_{N-1}$, which form a very high speed waveform at the output, as shown in FIG. 9. The flexibility of amplitude, position, and duration modulation allows for a robust "programming" algorithm, increasing the number of possible waveforms that the AWG is capable of generating. By modulating the amplitude, position, and duration of the individual pulses, an arbitrary waveform can be constructed. This allows direct synthesis of arbitrary waveforms at a low cost and a high performance level. Symmetrically, an arbitrary correlating receiver structure can be constructed by using each of the sampler/pulser cells of the invention for "aperture generation" (i.e. sampling) rather than pulse generation.

The invention, by virtue of its ability to integrate a large number of precisely matched high-speed sampling cells or pulsers into a single integrated circuit, enables new architectures in signal, processing, amplification, data separation, equalization, mixing and filtering that formerly were not economical or practical to produce. For example, the invention can be incorporated into a system to provide a communication channel equalizer.

Figure 10:
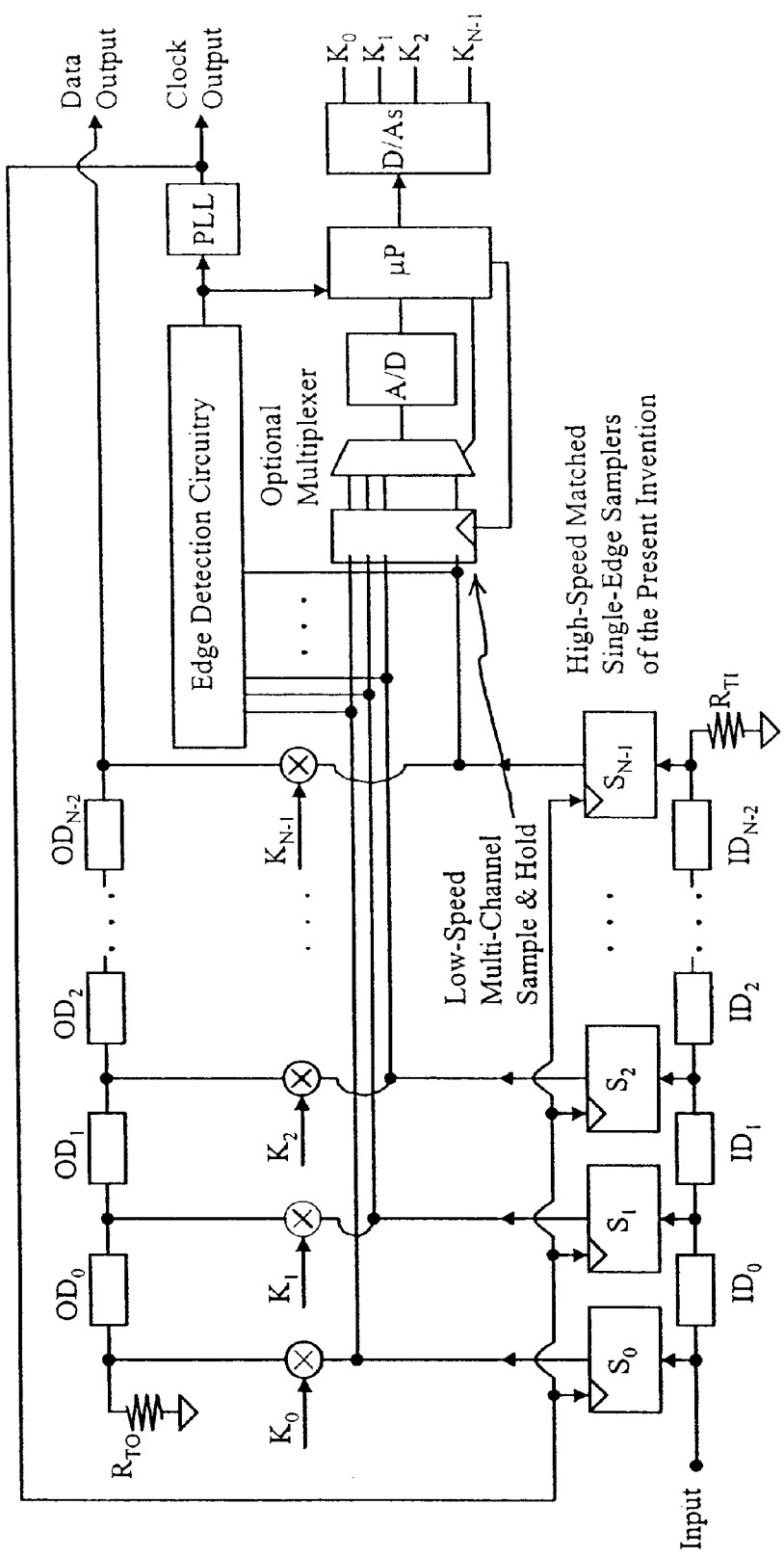
FIG. 10 is a block diagram of another system utilizing the embodiments of the invention.

Referring now to FIG. 10 a channel equalizer and data separator using N of the sampling cells So through $S_{N-1}$, of the invention is illustrated. The input signal is coupled into a first analog delay line $ID_0$ of a string of N-1 analog delay lines $ID_0$ through $ID_{N-2}$ and the first sampling cell or sampler $S_0$. The output from each respective analog delay line $ID_0$ through $ID_{N-2}$ is coupled into the sampling cells $S_1$ through $S_{N-1}$. A clock signal generated by a phase locked loop (PLL) is coupled into each of the sampling cells as the control signal, Control. Instead of having analog multipliers directly connected to the delayed input signals, the delayed input signals are first sampled simultaneously together by the sampling cells of the invention. In this manner an entire cycle of an input waveform is sampled together at one time. Next, processing of the sampled signals of the input waveform can be performed in a more leisurely way, such as using slower, more precise, lower power, parallel blocks of circuitry. In the circuitry of FIG. 10 for example, an array of N analog multipliers multiply the string of captured samples of the input signal waveform from the sampling cells with by a series of analog coefficients labeled $K_0$ through $K_{N-1}$. The output of each of these N multipliers is coupled into a respective delay line of a string of delay lines $OD_0$ through $OD_{N-2}$. From the delay line $OD_{N-2}$, an equalized output is generated on the Data Output which is a weighted sum of the sampled input signal at N different past times. In this way, a conventional Finite Impulse Response (FIR) filter is realized. The coefficients $K_0$ through $K_{N-1}$ can be generated by a conventional microprocessor-based system including a conventional single sampling gate formed by a low speed multi-channel sample and hold and a multiplexer, an analog-to-digital (A/D) converter, a microprocessor with a parallel data output and multiple digital-to-analog (D/A) converters to convert each parallel data output into the analog coefficients $K_0$ through $K_{N-1}$. The circuitry of FIG. 10 captures a single snapshot of a large number of points on the waveform, allowing a complete cycle of an input waveform to be held in a conventional, relatively slow multi-channel sample-and-hold, that can then be read at leisure by the microprocessor. The microprocessor can then compute coefficients $K_0$ through $K_{N-1}$ to implement an inverse filter which can compensate for the degradation that has occurred in a communications channel. The very high speed and tight matching of the precisely timed sequence of sampling apertures enabled by the invention allow sub-cycle sampling of waveforms of higher frequency than was formerly possible. This enables more intricate processing of portions of a high frequency waveform than was formerly feasible. For example, the edge-detection circuitry of conventional nature may be coupled to the outputs of the samplers in FIG. 10. It will also be obvious to one skilled in the art that the edge detection circuitry could alternatively be connected to the outputs of the low-speed multipliers in FIG. 10, with an output coupled to the phase-locked loop (PLL). The edge detection circuit can determine the boundaries of each bit cell on a cell-by cell basis, enabling more frequent determination of the bit cell boundaries, and consequently more accurate generation of a clock waveform in the middle of each bit cell. This ability to more quickly extract a clock waveform out of the raw signal is very important in communications systems in which there is rapid frequency-hopping, or other requirements which require very rapid synchronization to an incoming data stream. To implement an FIR filter that is capable of removing large amounts of smearing in the communication channel, the total delay of the N−1 delay lines may exceed the time duration of the impulse-spread function of the communication channel. This may require that the total delay of the N−1 delay lines be equal to up to several times the period of the Control signal which is used as both the Clock Output of the data separator, and the clock for samplers $S_0$ through $S_{N-1}$.

The sampling aperture and pulser architecture of the invention, by virtue of its scalability to large arrays of matched fast samplers and pulsers on a single integrated circuit, can also enable the use of parallel signal processing, in the analog domain, at higher speeds than was formerly possible.

Figure 11:
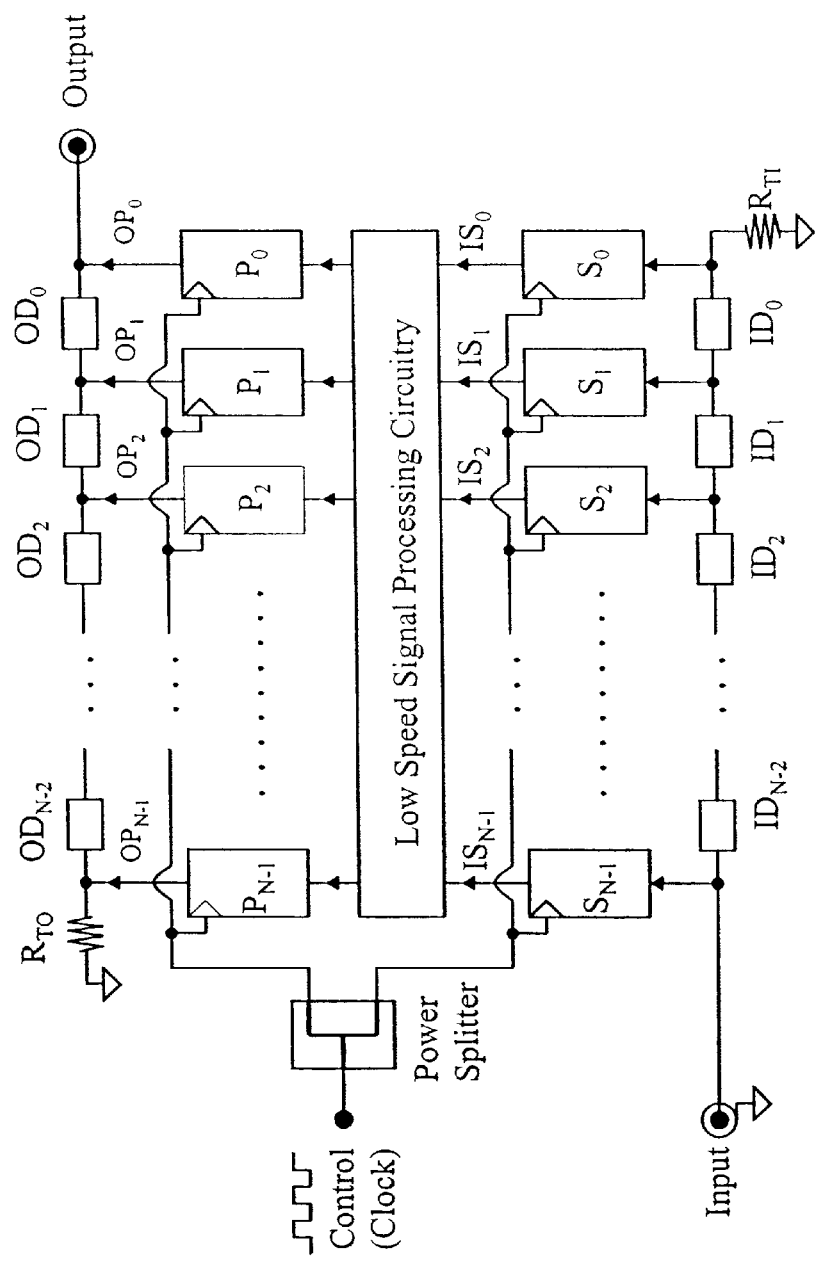
FIG. 11 is a block diagram of another system utilizing the embodiments of the invention.
Figure 12:
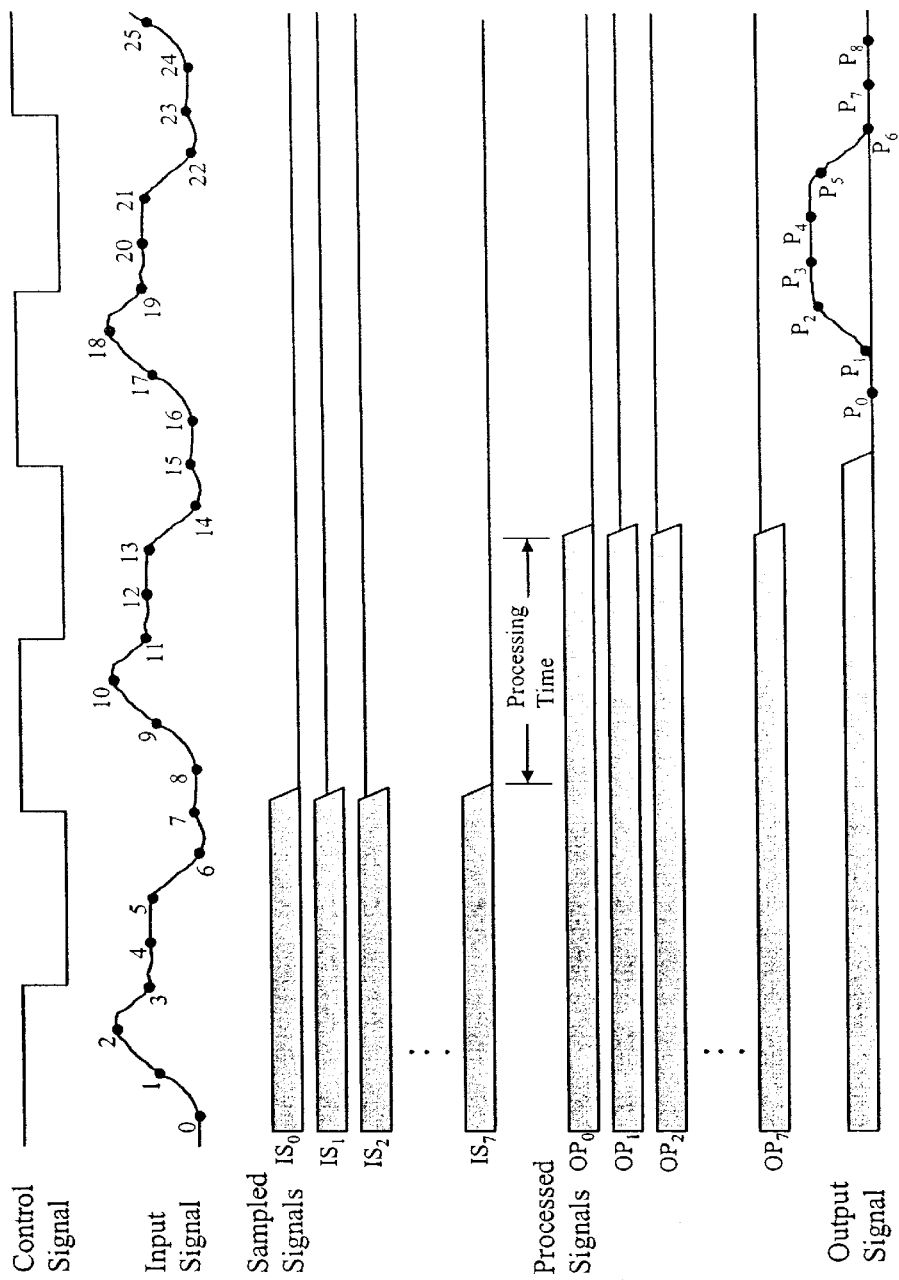
FIG. 12 is a waveform diagram illustrating the operation of the system illustrated in FIG. 11.

Referring now to FIG. 11, a generalized signal processing architecture is illustrated that can be used to implement a wide variety of filters, correlators, frequency mixers and modulators, microwave amplifiers, Viterbi and other convolutional decoders, and almost any other linear and non-linear signal processing system at high frequencies. The generalized signal processing architecture shown in FIG. 11 consists of an input terminal (Input) coupled into a first analog delay line $ID_{N-2}$ of a string of N−1 analog delay lines, $ID_0$ through $ID_{N-2}$ with the output of the last analog delay of the string, $ID_0$ coupled to a terminating resistor $R_{TT}$. The outputs of the delay lines, each containing a copy of the input signal delayed by an ever-increasing amount, are coupled into N samplers, $S_0$ through $S_{N-1}$, each of which are a sampler/pulser circuit in accordance with an embodiment of the invention. On each falling edge of the control signal, the N samplers $S_0$ through $S_{N-1}$ take a snapshot of the input and the N−1 delayed copies of the input generating data samples $IS_0$ through $IS_{N-1}$. The N samplers $S_0$ through $S_{N-1}$ preserve these data samples for a time equal to typically one to several cycles of the input waveform, depending upon the amount of time history needed for the processing. These preserved samples are coupled into low-speed or medium-speed circuitry which performs any desired signal processing operations on the preserved data from the N samplers. The N outputs generated by the low/medium speed signal processing circuitry are coupled to N pulse generators, $P_0$ through $P_{N-1}$, each of which are a pulse generator circuit (i.e. a pulser) in accordance with an embodiment of the invention. The N pulse generators, $P_0$ through $P_{N-1}$, take a simultaneous snapshot of the N outputs of the low/medium speed signal processing circuitry on each falling edge of the control signal, Control, and generate N simultaneous pulses $OP_0$ through $OP_{N-1}$ that are proportional in amplitude to the N respective outputs of the low/medium speed signal processing circuitry. These simultaneously generated pulse outputs $OP_0$ through $OP_{N-1}$ of $P_0$ through $P_{N-1}$, respectively, are coupled respective inputs of a string of delay lines $OD_0$ through $OD_{N-2}$, which then create a continuous waveform, consisting of N sequential voltage values, each lasting the length of one delay line, at the output terminal, Output. In this way, the circuitry of FIG. 11 breaks down a continuous waveform into a sequence of N rapidly acquired time samples, each of which can be processed at a rate that is N times slower, with the result transformed back into a sequence of N very rapidly changing output samples. Every time the control signal, Control, makes a transition in one direction a new acquisition of N samples (or N/M samples in the case where the delay line string has a total delay of M times the clock period, as might be required when processing signals in which several cycles of signal are required in the processing) is sampled, processed, and converted into an output stream, as shown in the waveform diagrams of FIG. 12.

While the above idea of taking a rapid sequence of samples, storing or holding them for a period of time, processing them in parallel, and then re-serializing the result of these parallel outputs into a rapid sequence of output signal samples is not novel, the architecture of the invention makes such processing practical for much faster signals than was formerly possible. For example, conventional microwave image-reject mixers, which are used for converting an RF signal into a near-baseband signal, have a very limited frequency range over which they can operate—typically less than an octave in bandwidth. By utilizing the system architecture illustrated in FIG. 11 with the sampler/pulser circuit, in which low-speed signal processing circuitry is suitably designed, an improved image reject mixer can be realized which would have a frequency range of several octaves, and can be used at much higher frequencies.

Similarly, amplifiers with better linearity and flatter frequency response, and faster active filters than were formerly possible may be implemented by using the system architecture of FIG. 11 with the sampler/pulser circuit, with suitably designed low-speed signal processing circuitry. These benefits result from the invention's ability to take a series of very fast samples of a high speed waveform, and have the processing of each of the resulting samples performed by a low-speed signal processing circuit which can be manufactured with better linearity and precision than the high speed circuitry that would otherwise be required to directly process the signals.

Figure 13:
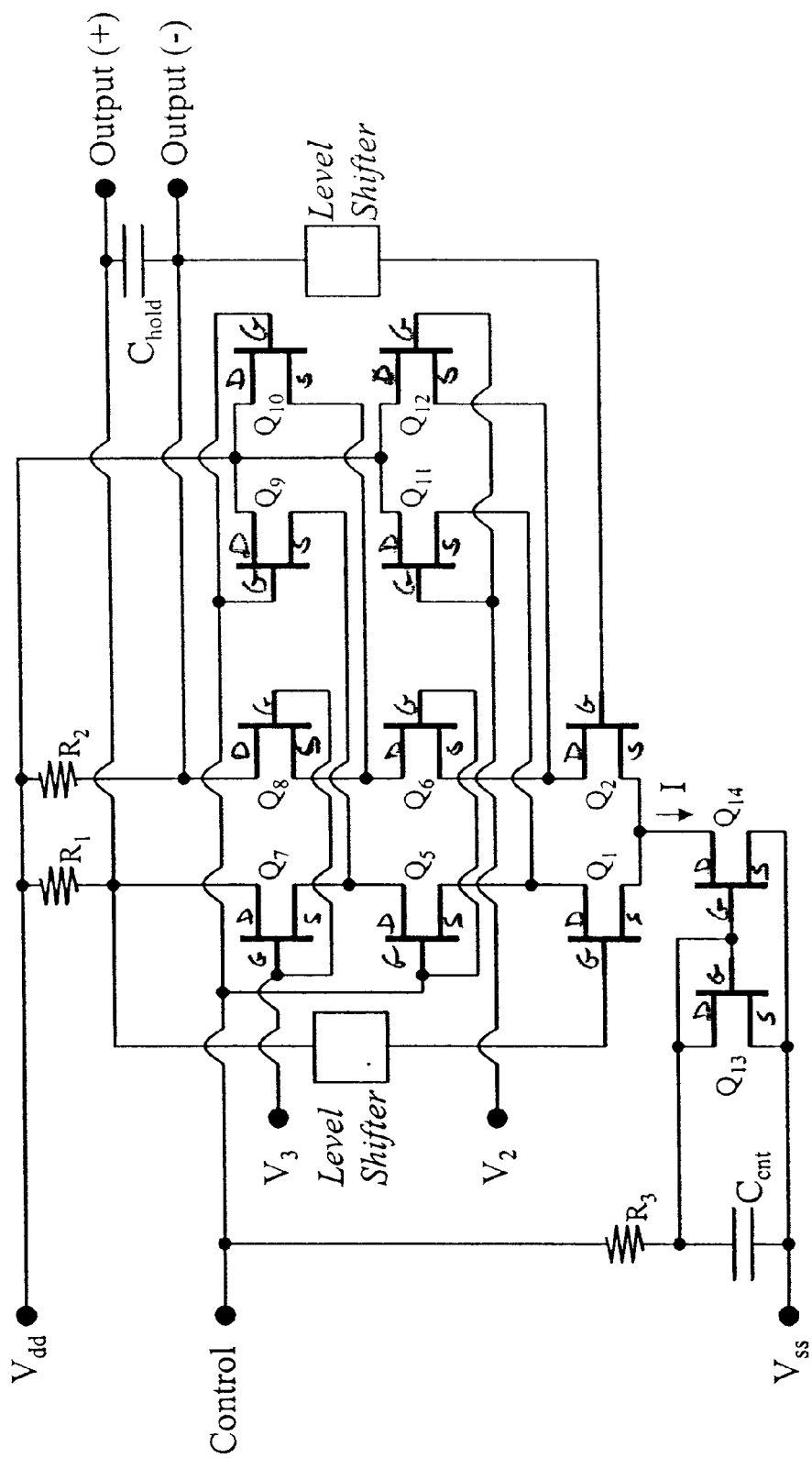
FIG. 13 is a schematic diagram of another embodiment of the invention.

Referring now to FIG. 13, another application of sampler/pulser circuits is in the fabrication of ultra-fast digital switching elements. For example, the circuit of FIG. 13 illustrates a sampler/pulser circuit configured as a toggle-type flip-flop capable of acting as a prescaler at frequencies in excess of 20 gigaHertz. The inverting output of the sampler/pulser circuit is connected, via two conventional level shifters, to its non-inverting input terminal, and vice versa, as shown in FIG. 13. Transistors Q1, Q2, and Q5 through Q12 and R1 and R2 are connected similarly as described with reference to the circuit of FIG. 1, with transistors Q3 and Q4 being absent. A current source that can be turned on and off by control voltage, Control, is composed of transistors Q13 and Q14 and resistor R3 and coupled together as shown and illustrated. The transistors Q13 and Q14 and resistor R3 provided that after the control signal has gone low the current source is turned off, and I goes to near zero.

Figure 14:
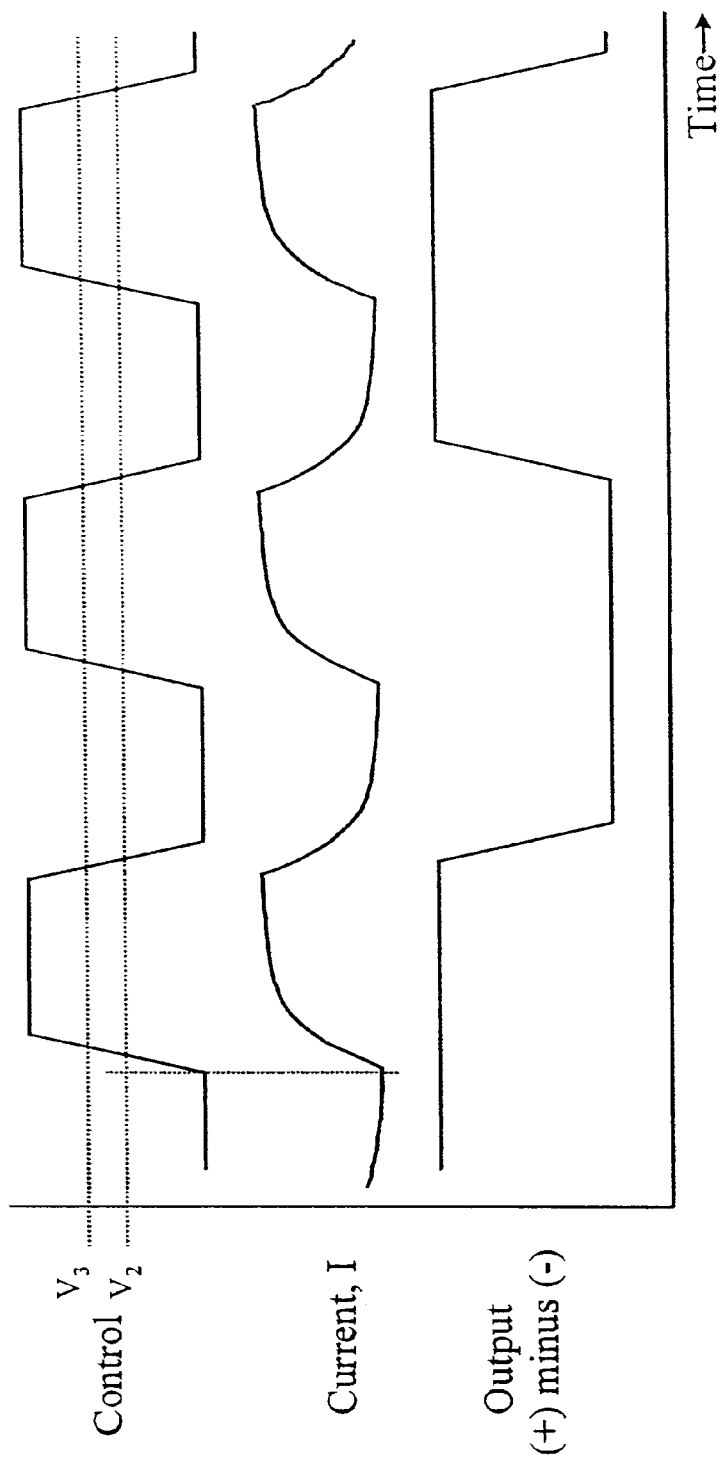
FIG. 14 is a waveform diagram illustrating the operation of the embodiment of the invention illustrated in FIG. 13.

Referring now to FIG. 14, a waveform diagram of the operation of the toggle-type flip-flop circuit of FIG. 13 is illustrated. As long as the transition time of the control signal transition from $V_3$ to $v_2$ is shorter than the delay time from the input terminals to the output terminals of the sampler, the circuit of FIG. 13 will toggle (switch state of the outputs) on every second negative transition of the control signal, producing an output frequency that is one-half of the input frequency, as shown in FIG. 14.

It should be noted that the current source is turned on and off using a delayed version of the Control signal, so that the flip-flop does not sample the inputs on the rising edge of the control signal waveform, but only samples the inputs on the falling edge. In this way, the circuit correctly divides by two. Also, since the state of the output is held by a hold capacitor, its value will droop with time, with a time constant equal to $(R_1+R_2) \times C_{hold}$. For this reason, the circuit should not be operated at a frequency below approximately $1/[2 \times (R_1+R_2) \times C_{hold}]$.

It will be apparent to those skilled in the art that the invention can also be used as an element in complex high-speed modulators and demodulators, frequency doublers (owing to the invention generating output pulses on both the rising and falling edges of a single cycle of the control waveform), and high-speed custom logic elements. The combination of high speed and scalability and the ability to reject imperfections in the sampling control signal enable the invention to be used as a building block in new integrated circuits capable of parallel processing a large number of rapidly-acquired samples, potentially opening up new fields of microwave sampling applications that will allow more complex and more accurate real-time processing of fast signals than was formerly possible.

The invention has a number of advantages over the prior art. One advantage of the invention is that fast sampling is provided. Another advantage is that multiple sampling apertures can be precisely placed in time, and matched to each other in duration, due to the invention's ability to be easily integrated on a monolithic integrated circuit. A further advantage is the invention's tolerance of aberrations at the beginning and end of the control signal. Other advantages of the invention will be recognized by those of ordinary skill in the art after reading through this disclosure.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, the invention has been described herein with reference to enhancement mode MESFETs corresponding to Gallium Arsenide (GaAs) technology. Other transistor types and semiconductor technologies may be used to implement the present invention including NFETs, and/or PFETs corresponding to MOS technology or CMOS technology, PNP and/or NPN transistors of bipolar semiconductor technology as well as N-type and/or P-type FETs of a gallium-arsenide type, indium phosphide type or silicon-germanium type of semiconductor technology. Additionally, it is possible to implement the invention or some of its features in hardware, firmware, software or a combination thereof where the software is provided in a processor readable storage medium such as a magnetic, optical, or semiconductor storage medium or the like.

What is claimed is:

1. A sampler/pulser circuit comprising:
   a differential pair having control terminals coupled to input terminals to receive a data input signal;
   level activated switching elements coupled to the differential pair, the level activated switching elements responsive to a first voltage level and a second voltage level; and
   a control input coupled to the level activated switching elements, the control input to activate the level switching elements to sample the data input signal or generate a pulse responsive thereto when a voltage level of the control input is between the first voltage level and the second voltage level.

2. The sampler/pulser circuit of claim 1 wherein,
   the first voltage level is greater than the second voltage level, and
   the control input activates the level switching elements to sample the data input signal or generate a pulse responsive thereto when the voltage level of the control input transitions from being greater than to less than the first voltage level and deactivates the level switching elements when the voltage level of the control input transitions from being greater than to less than the second voltage level.

3. The sampler/pulser circuit of claim 1 wherein,
   the first voltage level is greater than the second voltage level, and
   the control input activates the level switching elements to sample the data input signal or generate a pulse responsive thereto when the voltage level of the control input transitions from being less than to greater than the second voltage level and deactivates the level switching elements when the voltage level of the control input transitions from being less than to greater than the first voltage level.

4. The sampler/pulser circuit of claim 1 wherein,
   the level switching elements are differentially paired transistors.

5. The sampler/pulser circuit of claim 1 wherein,
   the level switching elements are differentially paired diodes.

6. A circuit comprising:
   a first transistor and a second transistor providing a differential input stage, the first transistor and the second transistor having control terminals coupled to input terminals to receive a data input signal and source terminals coupled to a current source;
   a third transistor and a fourth transistor each having control terminals coupled together and to a first voltage level, the third transistor and the fourth transistor each having a source terminal coupled to the drain terminal of the first transistor and the second transistor respectively;

a fifth transistor and a sixth transistor each having control terminals coupled together and to a control signal, the fifth transistor and the sixth transistor each having a source terminal coupled to the drain terminal of the third transistor and the fourth transistor respectively;

a seventh transistor and an eighth transistor each having control terminals coupled together and to a third voltage level, the seventh transistor and the eighth transistor each having a source terminal coupled to the drain terminal of the fifth transistor and the sixth transistor respectively, the seventh transistor and the eighth transistor each having a drain terminal coupled to a first and second output terminal respectively of a differential output; and a first resistor and a second resistor each having one end coupled to a power supply and an opposite end coupled to the drain terminal of the seventh transistor and the eighth transistor respectively and the first and second output terminal respectively.

7. The circuit of claim 6 wherein, the third, fourth, fifth, sixth, seventh, and eighth transistors are level-activated switching elements responsive to the first voltage level, the third voltage level, and the control signal.

8. The circuit of claim 7 wherein, the control signal activates the level switching elements to sample the data input signal or generate a pulse responsive thereto when a voltage level of the control signal is between the first voltage level and the third voltage level.

9. The circuit of claim 6 further comprising:

a third resistor and a fourth resistor each having having one end coupled to the power supply and an opposite end coupled to the drain terminal of the fifth transistor and the sixth transistor respectively and the source terminal of the seventh transistor and the eighth transistor respectively.

10. The circuit of claim 6 further comprising:

a capacitor having one end coupled to the first out put terminal and another end coupled to the second output terminal.

11. The circuit of claim 6 further comprising:

a ninth transistor and a tenth transistor each having control terminals coupled together and to the control signal and each having a source terminal coupled to the drain terminal of the fifth transistor and the sixth transistor respectively and the source terminal of the seventh transistor and the eighth transistor respectively, and each having a drain terminal coupled together and to the power supply.

12. The circuit of claim 6 further comprising:

an eleventh transistor and a twelfth transistor each having control terminals coupled together and to a second voltage level and each having a source terminal coupled to the source terminal of the fifth transistor and the sixth transistor respectively and the drain terminal of the third transistor and the fourth transistor respectively, and each having a drain terminal coupled together and to the power supply.

13. The circuit of claim 6 wherein, the transistors are one of Gallium Arsenide (GaAs) MESFET, GaAs Heterojunction Bipolar Transistor (HBT), GaAs High Electron Mobility Transistor (HEMT), Indium Phosphide (InP) transistor, Silicon-Germanium (SiGe), Silicon bipolar or MOS transistors.

14. A method comprising:

providing a control signal changing from a first voltage level to a second voltage level;

sampling a data input signal in response to a change in the voltage level of the control signal between the first voltage level and the second voltage level; and maintaining the sample of the data signal in response to the voltage level of the control signal being outside a range of voltage levels between the first voltage level and the second voltage level.

15. The method of claim 14 wherein, the sampling of the data input signal initiates at a first switching point and ends at a second switching point between the range of voltage levels between the first voltage level and the second voltage level.

16. A method comprising:

providing a control signal changing from a first voltage level to a second voltage level;

generating a pulse in an output signal in response to a change in the voltage level of the control signal between the first voltage level and the second voltage level; and maintaining a steady state in the output signal in response to the voltage level of the control signal being outside a range of voltage levels between the first voltage level and the second voltage level.

17. The method of claim 16 wherein, the generating of the pulse in the output signal initiates at a first switching point and ends at a second switching point between the range of voltage levels between the first voltage level and the second voltage level.

18. A sampler/pulser circuit comprising:

a differential pair having control terminals coupled to input terminals to receive a data input signal;

level activated switching elements coupled to the differential pair, the level activated switching elements responsive to a first voltage level and a second voltage level; and differential control inputs coupled to the level activated switching elements including a positive control signal and a negative control signal, the differential control inputs to activate the level switching elements to sample the data input signal or generate a pulse responsive thereto when a voltage level of the positive control signal is between a first switch point and a second switch point.

19. The sampler/pulser circuit of claim 18 wherein, the first voltage level is greater than the second voltage level, and the differential control inputs activate the level switching elements to sample the data input signal or generate a pulse responsive thereto when the voltage level of the positive control signal is between the first switch point and the second switch point and deactivates the level switching elements when the voltage level of the positive control signal is outside of the first switch point and the second switch point.

20. The sampler/pulser circuit of claim 18 wherein, the level switching elements are differentially paired transistors.

21. The sampler/pulser circuit of claim 18 wherein, the level switching elements are differentially paired diodes.

22. A circuit comprising:
- a first transistor and a second transistor providing a differential input stage, the first transistor and the second transistor having control terminals coupled to input terminals to receive a data input signal and source terminals coupled to a current source;
- a third transistor and a fourth transistor each having control terminals coupled together and to a first voltage level, the third transistor and the fourth transistor each having a source terminal coupled to the drain terminal of the first transistor and the second transistor respectively;
- a first diode and a second diode each having a cathode terminal coupled to the drain terminal of the third transistor and the fourth transistor respectively;
- a third diode and a fourth diode each having a cathode terminal coupled to an anode terminal of the first diode and the second diode respectively;
- a fifth diode and a sixth diode each having a cathode terminal coupled to the drain terminal of the third transistor and the fourth transistor respectively and each having an anode terminal coupled to a second voltage level;
- a first resistor and a second resistor each having one end coupled to a power supply and an opposite end coupled to an anode terminal of the third diode and the fourth diode respectively and the first and second output terminals respectively; and
- a third resistor and a fourth resistor each having one end coupled to a control signal, the third resistor having an opposite end coupled to the anode terminal of the first diode and the cathode terminal of the third diode and the fourth resistor having an opposite end coupled to the anode terminal of the second diode and the cathode terminal of the fourth diode.

23. The circuit of claim 22 wherein,
the third and fourth transistors and the first through sixth diodes are level-activated switching elements responsive to the first voltage level, the second voltage level, and the control signal.

24. The circuit of claim 23 wherein,
the control signal activates the level switching elements to sample the data input signal or generate a pulse responsive thereto when a voltage level of the control signal is between the first voltage level and the second voltage level.

25. The circuit of claim 22 further comprising:
a capacitor having one end coupled to the first output terminal and another end coupled to the second output terminal.

26. The circuit of claim 22 wherein,
the transistors are one of Gallium Arsenide (GaAs) MESFET, GaAs Heterojunction Bipolar Transistor (HBT), GaAs High Electron Mobility Transistor (HEMT), Silicon-Germanium (SiGe), Indium Phosphide (InP), Silicon bipolar or MOS transistors.

27. A method comprising:
providing a control signal transitioning between first voltage levels and second voltage levels;
generating a first pulse in an output signal in response to a transition in the control signal from the first voltage level to the second voltage level; and
generating a second pulse in the output signal in response to a transition in the control signal from the second voltage level to the first voltage level.

28. The method of claim 27 further comprising:
maintaining a steady state in the output signal in response to the voltage level of the control signal being outside a range of voltage levels between the first voltage level and the second voltage level.

29. The method of claim 27 wherein,
the generating of the first pulse in the output signal initiates at a first switching point and ends at a second switching point between the first voltage level and the second voltage level.

30. The method of claim 27 wherein,
the generating of the second pulse in the output signal initiates at a second switching point and ends at a first switching point between the second voltage level and the first voltage level.

31. A method in a circuit without differentiating circuit elements and without pulse reversing elements comprising:
providing an electrical control signal;
generating an output signal having two transitions in response to a single transition of the electrical control signal;
wherein a first transition of the two transitions in the output signal is a rise of the output signal from an initial operating voltage to a second voltage; and
wherein the second transition of the two transitions in the output signal is a fall of the output signal to the initial operating voltage.

32. The method of claim 31 wherein,
the differentiating circuit elements are capacitors.

33. The method of claim 31 wherein,
the pulse reversing elements are transmission lines or delay lines.

34. A method in a circuit without differentiating circuit elements and without pulse reversing elements comprising:
providing a control signal;
in response to a single transition in the control signal, momentarily conveying to one or more output terminals a voltage proportional to the voltage on one or more respective input terminals; and
wherein the voltage conveyed to the one or more output terminals is proportional to the voltage on the one or more respective input terminals during a period of time when the single transition occurs in the control signal.

35. The method of claim 34 wherein,
the differentiating circuit elements are capacitors.

36. The method of claim 34 wherein,
the pulse reversing elements are transmission lines or delay lines.

37. The method of claim 34 further comprising:
holding on the one or more output terminals the voltage conveyed thereto after completion of the single transition in the control signal the differentiating circuit elements are capacitors.

38. The method of claim 37 wherein,
the holding is provided by a conventional electrical storage means.

39. The method of claim 38 wherein,
the conventional electrical storage means is a capacitor.

40. A signal processing system comprising:
a first string of a plurality of analog delay lines coupled in series together, a first analog delay line of the first string to receive a data input signal and the first string of the plurality of analog delay lines to generate delayed data input signals;

a plurality of sampler circuits, a first sampler circuit to receive the data input signal and the other sampler circuits to receive the respective delayed data input signals to generate samples of a cycle of a waveform of the data input signal, each of the plurality of sampler circuits including level activated switching elements to sample the data input signal and the respective delayed data input signals on a transition of a clock signal at one time;

signal processing circuitry coupled to the outputs of the plurality of sampler circuits to process the samples of the cycle of the waveform of the data input signal; and a second string of a plurality of analog delay lines coupled in series together, each respective analog delay line of the second string of the plurality of analog delay lines responsive to the processed samples of the cycle of the waveform of the data input signal and to generate an output signal.

41. The signal processing system of claim 40 wherein, the signal processing circuitry is a plurality of analog multipliers coupled to the plurality of sampler circuits to multiply a respective coefficient with each respective sample of the cycle of the waveform of the data input signal.

42. The signal processing system of claim 40 further comprising:

a plurality of pulser circuits coupled between the outputs of the signal processing circuitry and the second string of the plurality of analog delay lines, each respective pulser circuit to receive the processed sample and generate a pulsed output in response thereto.

43. A waveform generating system comprising:

a microprocessor to generate a plurality of digital signals corresponding to a desired shape of a waveform;

a plurality of digital to analog converters coupled to the microprocessor, each of the plurality of digital to analog converters to receive one of the plurality of digital signals to generate a corresponding analog level;

a plurality of samplers/pulsers coupled to the plurality of digital to analog converters, each of the plurality of samplers/pulsers to receive the respective analog level and generate a pulse in response thereto upon receiving a transition in a control signal;

a string of a plurality of analog delay lines coupled in series together and coupled to the plurality of samplers/pulsers, each analog delay line in the string of the plurality of analog delay lines to receive a respective pulse from the plurality of samplers/pulsers and generate an output waveform at one end of the string of the plurality of analog delay lines.

44. The waveform generating system of claim 43 wherein, one of the plurality of samplers/pulsers couples to an output terminal to generate the output waveform, and one of the analog delay lines in the string of the plurality of analog delay lines couples to the output terminal and the one of the plurality of samplers/pulsers to generate the output waveform.

45. The waveform generating system of claim 43 wherein, each of the plurality of samplers/pulsers include level activated switching elements to generate a pulse in response to the respective analog level during the transition of the control signal at the same time.

* * * * *